(12) United States Patent
Kawai et al.

(10) Patent No.: US 12,021,501 B2
(45) Date of Patent: Jun. 25, 2024

(54) RESONATOR AND RESONANCE DEVICE

(71) Applicant: Murata Manufacturing Co., Ltd., Nagaokakyo (JP)

(72) Inventors: Ryota Kawai, Nagaokakyo (JP); Yuichi Goto, Nagaokakyo (JP); Yoshihisa Inoue, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 711 days.

(21) Appl. No.: 17/189,832

(22) Filed: Mar. 2, 2021

(65) Prior Publication Data

US 2021/0184651 A1 Jun. 17, 2021

Related U.S. Application Data

(63) Continuation of application No. PCT/JP2019/038292, filed on Sep. 27, 2019.

(30) Foreign Application Priority Data

Sep. 28, 2018 (JP) ................................ 2018-183874

(51) Int. Cl.
*H03H 9/17* (2006.01)
*H03H 9/02* (2006.01)
*H03H 9/15* (2006.01)

(52) U.S. Cl.
CPC .......... *H03H 9/17* (2013.01); *H03H 9/02244* (2013.01); *H03H 2009/02488* (2013.01); *H03H 2009/155* (2013.01)

(58) Field of Classification Search
CPC ............................ H03H 9/17; H03H 9/02244
See application file for complete search history.

(56) References Cited

U.S. PATENT DOCUMENTS

| 10,659,004 B2 | 5/2020 | Goto et al. | |
| 10,749,496 B2 | 8/2020 | Yoshii et al. | |
| 10,790,800 B2 | 9/2020 | Hirota et al. | |
| 2015/0022276 A1* | 1/2015 | Yamada | H03B 5/30 331/158 |
| 2015/0137901 A1* | 5/2015 | Yamada | H03H 9/02157 310/370 |
| 2016/0233847 A1* | 8/2016 | Yamada | H03B 5/30 |

(Continued)

FOREIGN PATENT DOCUMENTS

| JP | 2016149604 A | 8/2016 |
| WO | 2016174789 A1 | 11/2016 |

(Continued)

OTHER PUBLICATIONS

Written Opinion of the International Search Authority issued for PCT/JP2019/038292, date of mailing Dec. 3, 2019.

(Continued)

*Primary Examiner* — Bryan P Gordon
(74) *Attorney, Agent, or Firm* — ArentFox Schiff LLP

(57) ABSTRACT

A resonator includes a base, at least one vibration arm, a frame, and a holding arm. The vibration arm includes a piezoelectric film, an upper electrode, and a lower electrode. The inequality Fs/Fm<1.9 or the inequality 2.1<Fs/Fm holds, where Fm is a frequency of a main or primary mode in the vibration arm, and Fs is a frequency of a spurious mode in the holding arm.

20 Claims, 14 Drawing Sheets

(56) References Cited

U.S. PATENT DOCUMENTS

| | | |
|---|---|---|
| 2018/0048286 A1 | 2/2018 | Goto et al. |
| 2018/0048288 A1 | 2/2018 | Hirota et al. |
| 2019/0074812 A1* | 3/2019 | Inoue .................. B81B 3/0072 |
| 2019/0097600 A1 | 3/2019 | Yoshii et al. |

FOREIGN PATENT DOCUMENTS

| | | |
|---|---|---|
| WO | 2016175161 A1 | 11/2016 |
| WO | 2017208568 A1 | 12/2021 |

OTHER PUBLICATIONS

International Search Report issued for PCT/JP2019/038292, date of mailing Dec. 3, 2019.

* cited by examiner

RESONATOR AND RESONANCE DEVICE

CROSS REFERENCE TO RELATED APPLICATIONS

The present application is a continuation of PCT/JP2019/038292 filed Sep. 27, 2019, which claims priority to JP Application No. 2018-183874, filed Sep. 28, 2018, the entire contents of each of which are incorporated herein by reference.

TECHNICAL FIELD

The present invention relates to a resonator and a resonance device that includes the resonator.

BACKGROUND

A resonance device, which is a kind of micro-electromechanical systems (MEMS), is currently used as a timing device incorporated in electronic apparatuses, such as smartphones. The resonance device includes, for example, a lower cover, an upper cover, and a resonator placed in a cavity defined between the upper cover and the lower cover. The resonator includes, for example, a piezoelectric film, an upper electrode, a lower electrode, and an insulating film. The upper and lower electrodes are laid with the piezoelectric film therebetween. The insulating film is laid between layers in the resonator or is laid on a surface of the resonator.

Patent Document 1 (identified below) discloses a specific configuration of such a resonator. The resonator disclosed therein includes a base section, vibration arms, a holding part, and a pair of holding arms. The vibration arms extend from a tip portion of the base section. The holding part holds the base section. Each holding arm of the pair of holding arms forms a connection between the base section and the holding part. One of the holding arms extends toward a rear frame of the holding part from a rear end portion of the base section. The holding arm is bent toward a left frame of the holding part and is further bent toward a front frame of the holding part. Moreover, the holding part is again bent toward the left frame of the holding part and is connected to the left frame. Similarly, the other holding arm is connected to a right frame of the holding part.

Patent Document 1: International Publication No. 2017/208568.

A conventional resonator involves application of voltage on vibration arms through traces disposed on the holding arms, which in turn have electric fields. When the vibration arms vibrate in the main or primary mode, the holding arms vibrate in the spurious mode. The spurious mode would couple with the main mode when the frequency of the spurious mode becomes close to an integer multiple of the frequency of the main mode. As a result, the drive level dependency (DLD) characteristics will degrade.

The resonator disclosed in Patent Document 1 has a high degree of design flexibility in terms of the length of the holding arms, which is one of frequency-determining parameters for the spurious mode. Therefore, there is a likelihood that the frequency of the spurious mode will become close to an integer multiple of the frequency of the main mode.

SUMMARY OF THE INVENTION

The exemplary embodiments of the present invention therefore are provided in view of such circumstances. Thus, it is an object of the present invention to provide a resonator having favorable DLD characteristics and a resonance device including the resonator.

In one exemplary aspect, a resonator is provided that includes a base, at least one vibration arm, a frame, and a holding arm. The at least one vibration arm includes a piezoelectric film, an upper electrode, and a lower electrode. The upper and lower electrodes are disposed on opposite sides with the piezoelectric film therebetween. The at least one vibration arm has a fixed end connected to a front end portion of the base section and an open end located away from the front end portion. The frame holds the base. The holding arm forms a connection between the base and the frame. The inequality Fs/Fm<1.9 or the inequality 2.1<Fs/Fm holds, where Fm is the frequency of a main mode in the at least one vibration arm, and Fs is the frequency of a spurious mode in the holding arm.

Moreover, a resonator is provided according to another exemplary aspect that includes a base, at least one vibration arm, a frame, and a holding arm. The at least one vibration arm includes a piezoelectric film, an upper electrode, and a lower electrode. The upper and lower electrodes are disposed on opposite sides with the piezoelectric film therebetween. The at least one vibration arm has a fixed end connected to a front end of the base and an open end located away from the front end. The frame holds the base. The holding arm forms a connection between the base and the frame. The holding arm includes a holding rear arm and a holding side arm. The holding rear arm is connected to a rear end opposite the front end of the base and extends along the rear end. The holding side arm is connected to the holding rear arm and extends along the at least one vibration arm. The inequality Lc/L5<0.520 or the inequality 0.550<Lc/L5 holds, where Lc is the distance between an edge farther than any other edge of the holding rear arm from the holding side arm and an edge farther than any other edge of the holding side arm from the holding rear arm, and L5 is the length of an imaginary vibration arm of constant width. The imaginary vibration arm is obtained by transforming the at least one vibration arm into a form whose moment of inertia is equal to the moment of inertia of the at least one vibration arm.

The exemplary embodiments of the present invention provide a resonator having favorable DLD characteristics and a resonance device including the resonator.

DETAILED DESCRIPTION OF EMBODIMENTS

Hereinafter, exemplary embodiments will be described with reference to the accompanying drawings. In the accompanying drawings, the same or like reference signs denote the same or like constituent components. The accompanying drawings are provided merely as examples. The individual components are schematically illustrated in terms of their dimensions and shapes. The following embodiments should not be construed as limiting the technical scope of the present invention.

First Exemplary Embodiment

Figure 1:
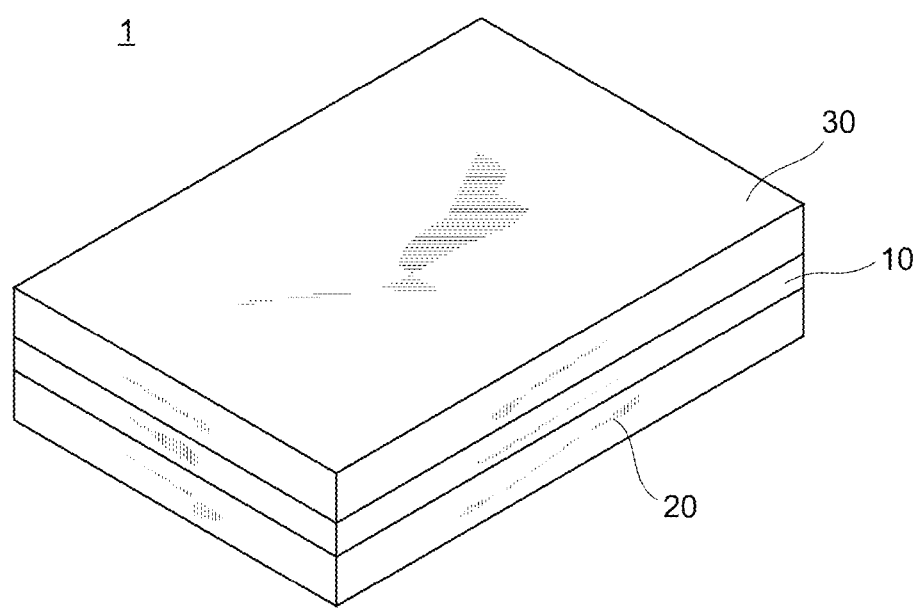
FIG. 1 is a schematic external perspective view of a resonance device according to a first exemplary embodiment.
Figure 1:
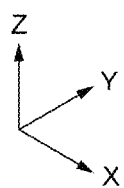
Figure 2:
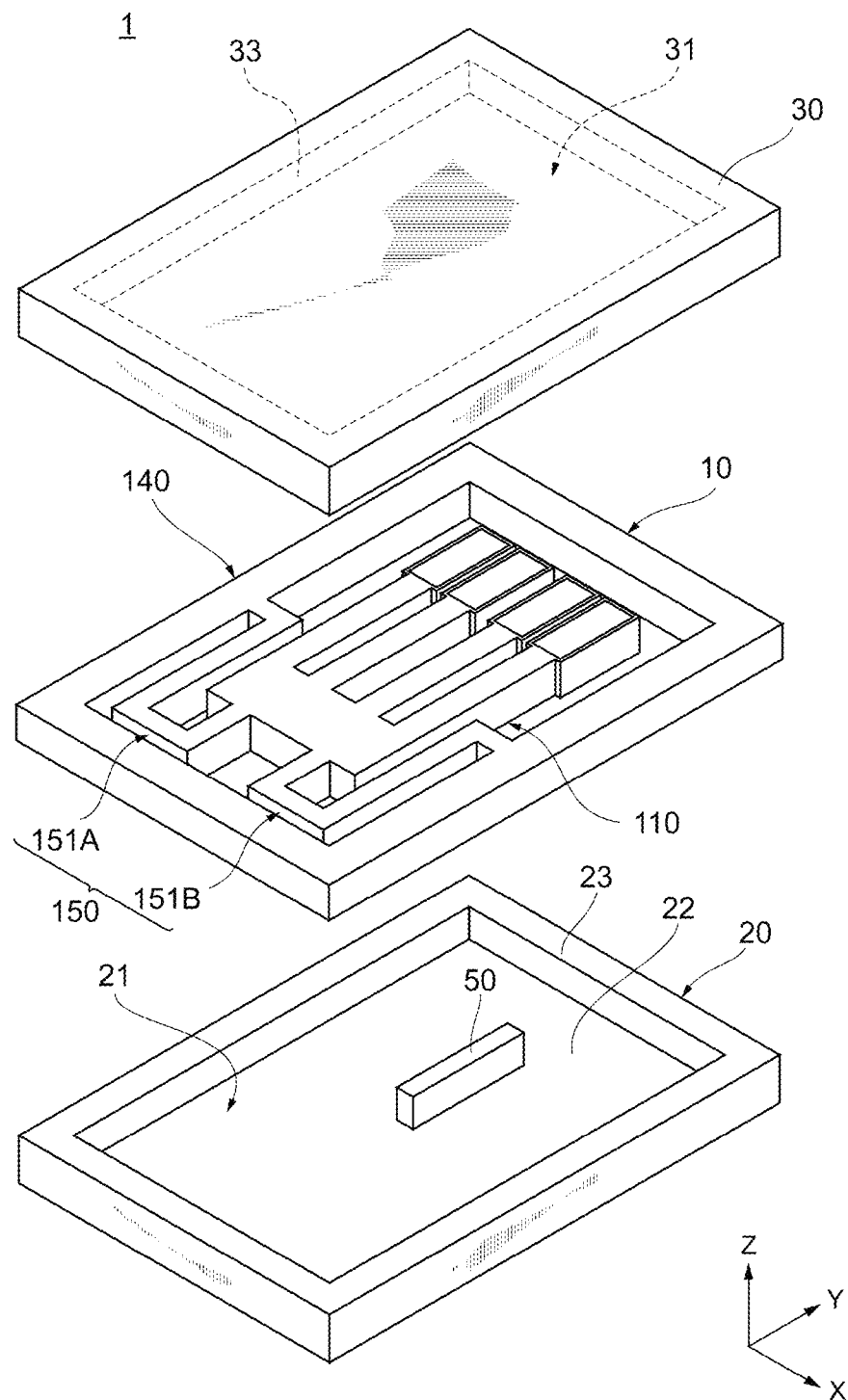
FIG. 2 is an exploded perspective view of the resonance device according to the first exemplary embodiment, schematically illustrating the structure of the resonance device.

The following describes the configuration of a resonance device 1 according to a first exemplary embodiment with reference to FIGS. 1 and 2. FIG. 1 is a schematic external perspective view of a resonance device according to the first embodiment. FIG. 2 is an exploded perspective view of the resonance device according to the first embodiment, schematically illustrating the structure of the resonance device.

Resonance Device 1

The resonance device 1 includes a resonator 10, a lower cover 20, and an upper cover 30. The lower cover 20 and the upper cover 30 face each other with the resonator 10 therebetween. The lower cover 20, the resonator 10, and the upper cover 30 are stacked on top of each other in the stated order in the Z-axis direction. The resonator 10 and the lower cover 20 are joined to each other, and the resonator 10 and the upper cover 30 are joined to each other. A vibration space for the resonator 10 is defined between the lower cover 20 and the upper cover 30 joined to each other through the resonator 10. In an exemplary aspect, the resonator 10, the lower cover 20, and the upper cover 30 are each made of a semiconductor substrate, a glass substrate, an organic substrate, or any other substrate that may be processed with a micromachining technology.

The following describes the individual components of the resonance device 1. According to these exemplary embodiments, the resonance device 1 is understood to be placed with the upper cover 30 on an upper side (i.e., on a top side) and the lower cover 20 on a lower side (i.e., on a back side).

Micro-electro-mechanical systems (MEMS) are used to produce the resonator 10, which is thus regarded as a MEMS resonator in the exemplary aspect. The resonator 10 includes a vibration part 110, a holding part 140 (or frame), and a holding arm 150. The vibration part 110 is held in the vibration space. The vibration part 110 may vibrate out of an X-Y plane, that is, in an out-of-plane bending-vibration mode. In some embodiments, the vibration part 110 may vibrate in the X-Y plane, that is, in an in-plane bending-vibration mode. The holding part 140 is in the form of, for example, a rectangular frame, in which the vibration part 110 is enclosed. The holding arm 150 forms a connection between the vibration part 110 and the holding part 140.

The lower cover 20 includes a bottom plate 22 and a side wall 23. The bottom plate 22 is in the form of a rectangular flat plate lying in an X-Y plane. The side wall 23 extends in the Z-axis direction from a peripheral edge portion of the bottom plate 22. The side wall 23 is joined to the holding part 140 of the resonator 10. The lower cover 20 has a recess 21 on its surface facing the vibration part 110 of the resonator 10. Moreover, the recess 21 is defined by a top surface of the bottom plate 22 and an inner surface of the side wall 23. The recess 21 is a cavity having a cuboid shape whose top is open. The vibration space for the resonator 10 is partially defined by the recess 21. The lower cover 20 includes, on its inner surface, a projection 50, which projects from the top surface of the bottom plate 22 into the vibration space.

The structure of the upper cover 30 and the structure of the lower cover 20 except for the projection 50 are mirror images of each other with respect to the resonator 10 disposed therebetween. More specifically, the upper cover 30 includes a bottom plate 32 and a side wall 33. The bottom plate 32 is in the form of a rectangular flat plate lying in an X-Y plane. The side wall 33 extends in the Z-axis direction from a peripheral edge portion of the bottom plate 32. The side wall 33 is joined to the holding part 140 of the resonator 10. In addition, the upper cover 30 has a recess 31 on its surface facing the vibration part 110 of the resonator 10. The recess 31 is a cavity having a cuboid shape whose bottom is open. The vibration space for the resonator 10 is partially defined by the recess 31.

In alternative embodiments, the structure of the lower cover 20 and the structure of the upper cover 30 may not be mirror images of each other. For example, the lower cover 20 or the upper cover 30 may be dome-shaped. The recess 21 of the lower cover 20 and the recess 31 of the upper cover 30 may have different shapes. For example, the recess 21 and the recess 31 may be of different depths.

Resonator 10

Figure 3:
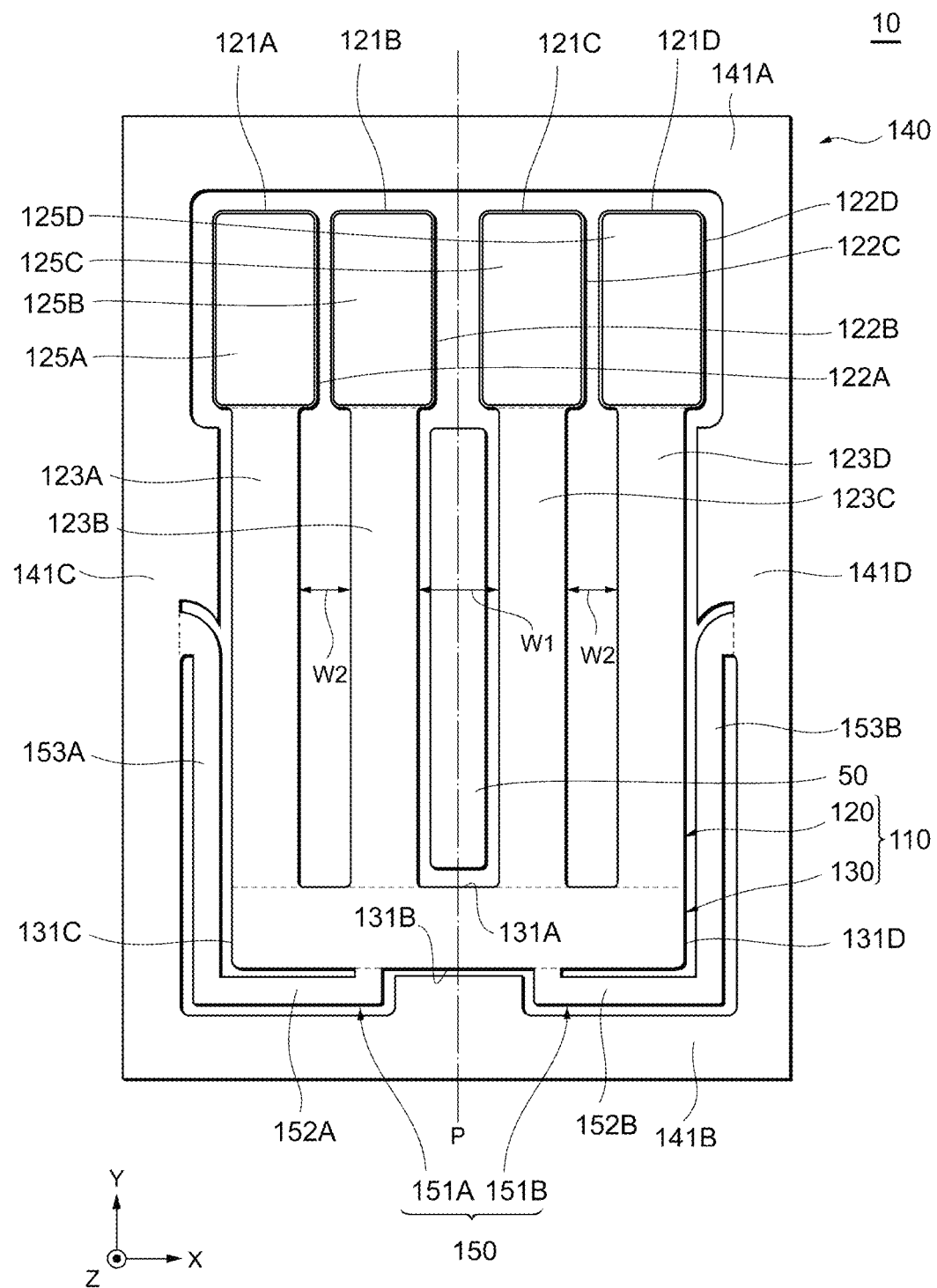
FIG. 3 is a plan view of a resonator according to the first exemplary embodiment, schematically illustrating the structure of the resonator.

The following describes, in more detail, the vibration part 110, the holding part 140, and the holding arm 150 of the resonator 10 according to an embodiment of the present invention with reference to FIG. 3. FIG. 3 is a plan view of a resonator according to the first embodiment, schematically illustrating the structure of the resonator.

Vibration Part 110

The vibration part 110 is enclosed in the holding part 140 when viewed in plan from the side on which the upper cover 30 is disposed. The vibration part 110 and the holding part 140 are arranged with a predetermined amount of clearance (or space) left therebetween. The vibration part 110 includes a vibration-generating section 120 and a base section 130 (or simply a base). The vibration-generating section 120 includes four vibration arms, which are denoted by 121A, 121B, 121C, and 121D, respectively. The base section 130 is connected to the vibration-generating section 120. In alternative aspects, it is not required that four vibration arms be included in the vibration-generating section 120. The vibration-generating section 120 may include one vibration arm or any other number of vibration arms. Moreover, the vibration-generating section 120 and the base section 130 in the present embodiment can be provided as one member.

Vibration Arms 121A to 121D

The vibration arms 121A, 121B, 121C, and 121D extend in the Y-axis direction and are arranged side by side in the stated order in the X-axis direction at predetermined spacings. The vibration arm 121A has a fixed end connected to a front end 131A of the base section 130 and an open end located away from the front end 131A of the base section 130. The base section 130 will be described later. The vibration arm 121A includes a mass addition portion 122A (simply a weight or weighted portino) and an arm portion 123A. The mass addition portion 122A is provided to the open end. The arm portion 123A extends from the fixed end and is connected to the mass addition portion 122A. Similarly, the vibration arms 121B, 121C, and 121D include their respective mass addition portions, which are denoted by 122B, 122C, and 122D, and also include their respective arm portions, which are denoted by 123B, 123C, and 123D. The arm portions 123A to 123D each have a width of about 50 μm in the X-axis direction and a length of about 450 μm in the Y-axis direction according to exemplary aspects.

Two of the four vibration arms, or more specifically, the vibration arms 121A and 121D can be considered outer vibration arms on the outer side in the X-axis direction. The other two, or more specifically, the vibration arms 121B and 121C can be considered inner vibration arms on the inner side in the X-axis direction. The width of a clearance between the arm portion 123B of the inner vibration arm 121B and the arm portion 123C of the inner vibration arm 121C is referred to as a release width W1. The width of a clearance between the arm portion 123A of the outer vibration arm 121A and the arm portion 123B of the inner vibration arm 121B is referred to as a release width W2, with the outer vibration arm 121A and the inner vibration arm 121B being adjacent to each other in the X-axis direction. The width of a clearance between the arm portion 123D of the outer vibration arm 121D and the arm portion 123C of the inner vibration arm 121C is also referred to as the release width W2, with the outer vibration arm 121D and the inner vibration arm 121C being adjacent to each other in the X-axis direction. The release width W1 is greater than the release width W2. The device adjusted such that the release width W1 is greater than the release width W2 offers improved vibration characteristics and improved durability. It is noted that the release width W1 and W2 are not limited to particular values. For example, the release width W1 may be about 25 μm, and the release width W2 may be about 10 μm. FIG. 3 is a non-limiting example; that is, the release width W1 between the arm portions of the respective inner vibration arms may be smaller than or equal to the release width W2 between each of the inner vibration arms and the corresponding outer vibration arm.

The mass addition portions 122A to 122D include, on their surfaces, their respective mass addition films, which are denoted by 125A to 125D. The weight per unit length (hereinafter also simply referred to as weight) of each of the mass addition portions 122A to 122D in the Y-axis direction is greater than the weight of the corresponding one of the arm portions 123A to 123D. The vibration part 110 may thus be small in size and have improved vibration characteristics.

In addition to providing the additional weight to tips of the vibration arms 121A to 121D, the mass addition films 125A to 125D enable adjustment of the resonant frequencies of the vibration arms 121A to 121D, or more specifically, the mass addition films 125A to 125D may each be partially removed for use as frequency adjustment films.

In the present embodiment, the width of each of the mass addition portions 122A to 122D in the X-axis direction is greater than the width of the corresponding one of the arm portions 123A to 123D in the X-axis direction. Moreover, the mass addition portions 122A to 122D having greater width have correspondingly greater weight. Although it is required that the weight of each of the mass addition portions 122A to 122D be greater than the weight of the corresponding one of the arm portions 123A to 123D, the width of each of the mass addition portions 122A to 122D in the X-axis direction is not necessarily as described above. In an alternative aspect, the width of each of the mass addition portions 122A to 122D in the X-axis direction may be equal to or smaller than the width of the corresponding one of the arm portions 123A to 123D in the X-axis direction.

When viewed in plan from the side on which the upper cover 30 is disposed, the mass addition portions 122A to 122D each have a substantially rectangular shape with four rounded corners (e.g., radius corners). The arm portions 123A to 123D are substantially rectangular, with radius corners being formed at the fixed ends connected to the base section 130 and at junctions connected to the mass addition portions 122A to 122D. Moreover, the shape of each of the mass addition portions 122A to 122D and the shape of each of the arm portions 123A to 123D are not necessarily as described above. For example, the mass addition portions 122A to 122D may each be substantially trapezoidal or substantially L-shaped. The arm portions 123A to 123D may each be substantially trapezoidal. In addition, blind grooves may be provided in the mass addition portions 122A to 122D and the arm portions 123A to 123D in such a manner that the top or bottom surfaces of the respective portions have openings, and/or holes may be provided in the mass addition portions 122A to 122D and the arm portions 123A to 123D in such a manner that the top and bottom surfaces of the respective portions have openings. The grooves and holes may be located away from side surfaces each forming a connection between the corresponding top surface and the corresponding bottom surface. Blind grooves and/or holes may be provided in the mass addition portions 122A to 122D and the arm portions 123A to 123D in such a manner that the side surfaces of the respective portions have openings.

When viewed in plan from the side on which the upper cover 30 is disposed, the arm portion 123B of the inner vibration arm 121B and the arm portion 123C of the inner vibration arm 121C are arranged side by side with the projection 50 therebetween. The projection 50 projects from the lower cover 20. The projection 50 extends along the arm portions 123B and 123C in the Y-axis direction. According to an exemplary embodiment, the projection 50 is about 240 μm long in the Y-axis direction and is about 15 μm long in the X-axis direction. The projection 50 makes the lower cover 20 less prone to warpage.

Base Section 130

Referring to FIG. 3, the base section 130 (or simply the base) viewed in plan from the side on which the upper cover 30 is disposed includes the front end portion 131A (or simply the front end), a rear end portion 131B (or simply the rear end), a left end portion 131C (or simply the left end or left side), and a right end portion 131D (or simply the right end or right side). The front end portion 131A, the rear end portion 131B, the left end portion 131C, and the right end portion 131D are each part of a peripheral region of the base section 130. Specifically, the front end portion 131A adjoins the vibration arms 121A to 121D and extends in the X-axis direction. The rear end portion 131B is on the side opposite the vibration arms 121A to 121D and extends in the X-axis direction. The left end portion 131C is in line with the vibration arm 121A in a distance from the vibration arm 121D and extends in the Y-axis direction. The right end portion 131D is in line with the vibration arm 121D in a distance from the vibration arm 121A and extends in the Y-axial direction.

The left end portion 131C has an end linked to one end of the front end portion 131A and has another end linked to one end of the rear end portion 131B. The right end portion 131D has an end linked the front end portion 131A and has another end linked to the rear end portion 131B. The front end portion 131A and the rear end portion 131B are on opposite sides in the Y-axis direction. The left end portion 131C and the right end portion 131D are on opposite sides in the X-axis direction. The front end portion 131A is connected with the vibration arms 121A to 121D.

When viewed in plan from the side on which the upper cover 30 is disposed, the base section 130 has a substantially rectangular shape whose long sides, respectively, are the front end portion 131A and the rear end portion 131B and whose short sides, respectively, are the left end portion 131C and the right end portion 131D. The base section 130 is substantially symmetric with respect to an imaginary plane P, which lies along perpendicular bisectors that respectively bisect the front end portion 131A and the rear end portion 131B. In alternative aspects, the base section 130 is not necessarily rectangular as illustrated in FIG. 3 and may have any other shape that is substantially symmetric with respect to the imaginary plane P. For example, the base section 130 may have a trapezoidal shape two sides of which, respectively, are the front end portion 131A and the rear end portion 131B, with either of these portions being longer than the other. At least one of the front end portion 131A, the rear end portion 131B, the left end portion 131C, and the right end portion 131D may be bent or curved.

The imaginary plane P is a plane of symmetry of the entirety of the vibration part 110. The imaginary plane P may thus be regarded as a plane passing through the center of the vibration arms 121A to 121D in the X-axis direction and is located between the inner vibration arms 121B and 121C. Specifically, each of the outer vibration arm 121A and the inner vibration arm 121B, which are adjacent to each other, and the corresponding one of the outer vibration arm 121D and the inner vibration arm 121C, which are adjacent to each other, are arranged symmetrically about the imaginary plane P.

The maximum distance between the front end portion 131A and the rear end portion 131B of the base section 130 in the Y-axis direction is herein referred to as a base section length and is, for example, about 40 μm. The maximum distance between the left end portion 131C and the right end portion 131D of the base section 130 in the X-axis direction is herein referred to as a base section width and is, for example, about 300 μm. As shown in FIG. 3, which illustrates a configuration example, the base section length is the length of the left end portion 131C or the right end portion 131D, and the base section width is the length of the front end portion 131A or the rear end portion 131B.

Frame 140

The holding part 140 (or simply the frame) is provided such that the vibration part 110 is held in the vibration space defined by the lower cover 20 and the upper cover 30. The vibration part 110 may, for example, be enclosed in the holding part 140. Referring to FIG. 3, the holding part 140 viewed in plan from the side on which the upper cover 30 is disposed includes a front frame 141A, a rear frame 141B, a left frame 141C, and a right frame 141D. The front frame 141A, the rear frame 141B, the left frame 141C, and the right frame 141D are each part of a substantially rectangular frame body in which the vibration part 110 is enclosed. Specifically, the front frame 141A is located beyond the vibration arms 121A to 121D when viewed from the base section 130 and extends in the X-axis direction. The rear frame 141B is located beyond the base section 130 when viewed from the vibration arms 121A to 121D and extends in the X-axis direction. The left frame 141C is located beyond the vibration arm 121A when viewed from the vibration arm 121D and extends in the Y-axis direction. The right frame 141D is located beyond the vibration arm 121D when viewed from the vibration arm 121A and extends in the Y-axis direction. The holding part 140 is symmetric with respect to the imaginary plane P.

The left frame 141C has an end connected to one end of the front frame 141A and another end connected to one end of the rear frame 141B. The right frame 141D has an end connected to the other end of the front frame 141A and another end connected to the other end of the rear frame 141B. The front frame 141A and the rear frame 141B are on opposite sides in the Y-axis direction with the vibration part 110 therebetween. The left frame 141C and the right frame 141D are on opposite sides in the X-axis direction with the vibration part 110 therebetween. It is noted that the holding part 140 is not necessarily in the form of a frame extending continuously in the circumferential direction. However, the holding part 140 preferably should extend along at least part of the periphery of the vibration part 110.

Holding Arm 150

The holding arm 150 is disposed on the inner side with respect to the holding part 140 and forms a connection between the base section 130 and the holding part 140. Referring to FIG. 3, the holding arm 150 viewed in plan from the side on which the upper cover 30 is disposed includes a left holding arm 151A and a right holding arm 151B. The left holding arm 151A forms a connection between the rear end portion 131B of the base section 130 and the left frame 141C of the holding part 140. The right holding arm 151B forms a connection between the rear end portion 131B of the base section 130 and the right frame 141D of the holding part 140. The left holding arm 151A includes a holding rear arm 152A and a holding side arm 153A, and the right holding arm 151B includes a holding rear arm 152B and a holding side arm 153B. As shown, the holding arm 150 is symmetric with respect to the imaginary plane P.

As further shown, the holding rear arms 152A and 152B extend from the rear end portion 131B of the base section 130 and lie between and the rear end portion 131B of the base section 130 and the holding part 140. Specifically, the holding rear arm 152A extends toward the rear frame 141B from the rear end portion 131B of the base section 130 and is bent to extend toward the left frame 141C. Moreover, the holding rear arm 152B extends toward the rear frame 141B from the rear end portion 131B of the base section 130 and is bent to extend toward the right frame 141D.

The holding side arm 153A extends along the outer vibration arm 121A and lies between the outer vibration arm 121A and the holding part 140. The holding side arm 153B extends along the outer vibration arm 121D and lies between the outer vibration arm 121D and the holding part 140. Specifically, the holding side arm 153A extends toward the front frame 141A from an end portion of the holding rear arm 152A adjacent to the left frame 141C and is bent to be connected to the left frame 141C. The holding side arm 153B extends toward the front frame 141A from an end portion of the holding rear arm 152B adjacent to the right frame 141D and is bent to be connected to the right frame 141D.

The holding side arms 153A and 153B, respectively, are connected to the left frame 141C and the right frame 141D in such a manner that the junction between the holding side arm 153A and the left frame 141C and the junction between the holding side arm 153B and the right frame 141D each face the arm portions 123A to 123D in the X-axis direction. In other words, the junction between the holding side arm 153A and the left frame 141C and the junction between the holding side arm 153B and the right frame 141D are closer than the fixed ends of the vibration arm 121A to 121D to the mass addition portions 122A to 122D and are closer than the mass addition portions 122A to 122D to the fixed ends. The mass addition portions 122A and 122D, each of which is wider than the corresponding one of the arm portions 123A and 123D, are not aligned with the holding side arms 153A and 153B in the X-axis direction. This layout and configuration enables a reduction in the dimension of the resonator 10 in the X-axis direction.

It is noted that the configuration of holding arm 150 is not necessarily as described above. For example, the holding arm 150 may be connected to the left end portion 131C and the right end portion 131D of the base section 130. Moreover, the holding arm 150 may be connected to the front frame 141A of the holding part 140 in another exemplary aspect.

Multilayer Structure

Figure 4:
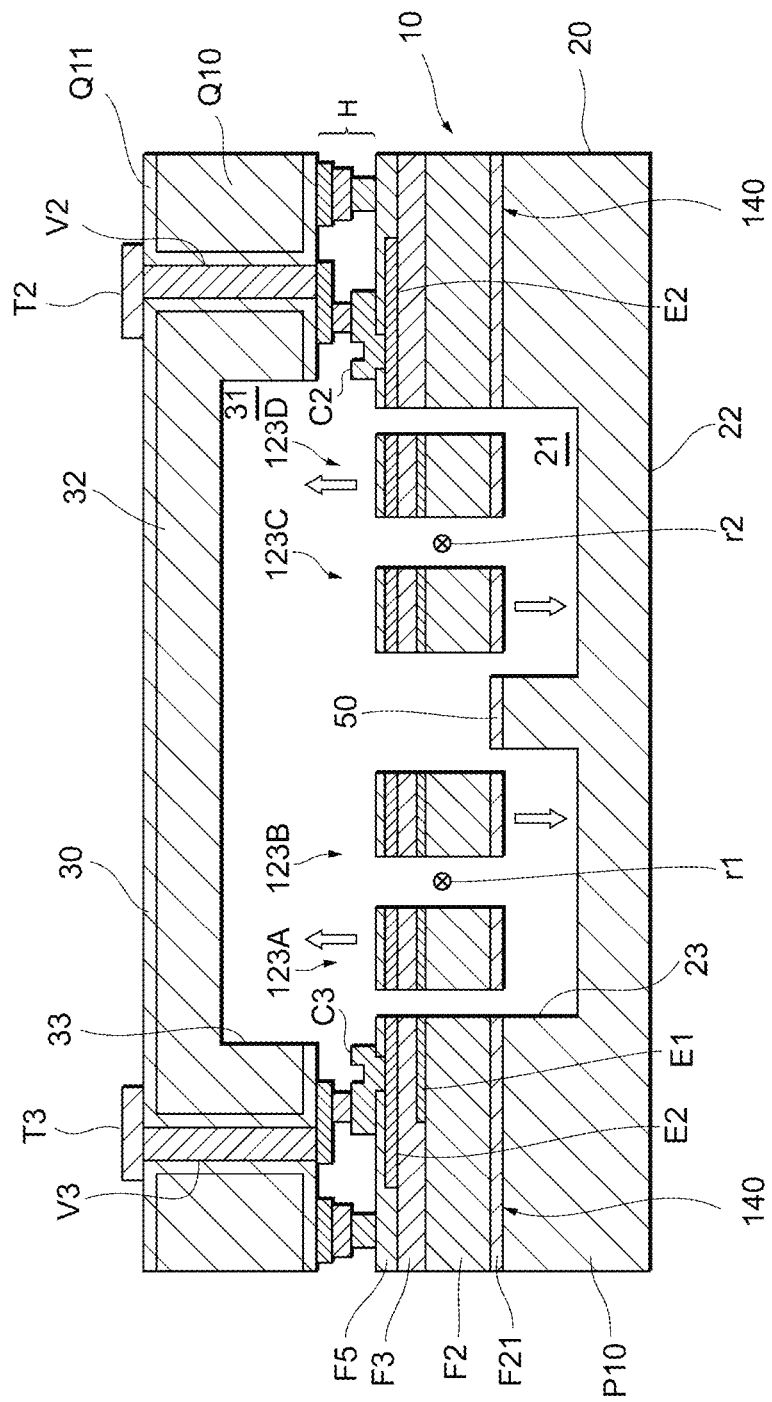
FIG. 4 is a sectional view of the resonance device taken along a line extending in the X-axis direction, schematically illustrating the multilayer structure of the resonance device in FIG. 1.
Figure 5:
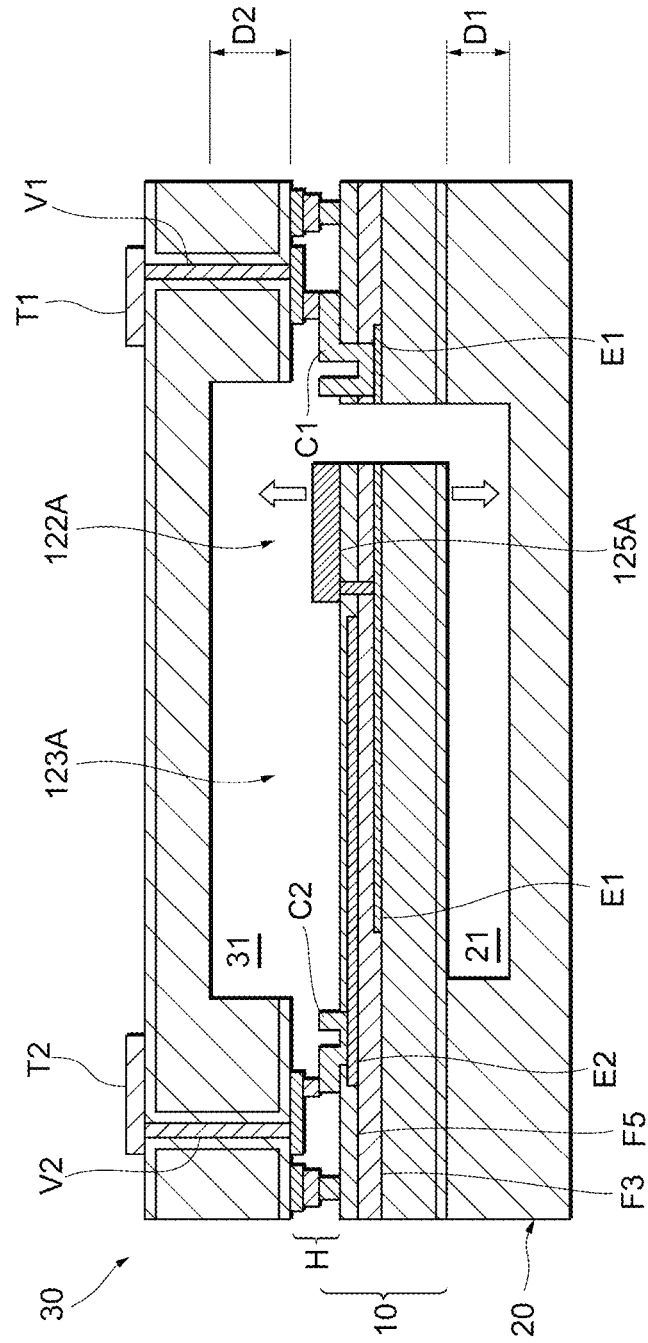
FIG. 5 is a sectional view of the resonance device taken along a line extending in the Y-axis direction, schematically illustrating the multilayer structure of the resonance device in FIG. 1.

The following describes the multilayer structure and actions of the resonance device 1 according to the first embodiment with reference to FIGS. 4 and 5. FIG. 4 is a sectional view of the resonance device taken along a line extending in the X-axis direction, schematically illustrating the multilayer structure of the resonance device in FIG. 1. FIG. 5 is a sectional view of the resonance device taken along a line extending in the Y-axis direction, schematically illustrating the multilayer structure of the resonance device in FIG. 1. To facilitate understanding of the exemplary embodiment of the multilayer structure of the resonance device 1, FIG. 4 schematically illustrates, for example, the arm portions 123A to 123D, an extended line C2, an extended line C3, a through-via electrode V2, and a through-via electrode V3 that are viewed in section. However, this does not necessarily mean that their cross sections are on the same plane. For example, the through-via electrodes V2 and V3 may be parallel to a Z-X plane defined by the Z-axis and the X-axis and may be located away, in the Y-axis direction, from the cross sections of the arm portions 123A to 123D. The same holds for FIG. 5; that is, to be of assistance in describing the multilayer structure of the resonance device 1, FIG. 5 schematically illustrates the mass addition portion 122A, the arm portion 123A, an extended line C1, the extended line C2, a through-via electrode V1, and the through-via electrode V2 that are viewed in section; however, this does not necessarily mean that their cross sections are on the same plane.

The holding part 140 of the resonator 10 of the resonance device 1 is disposed on and joined to the side wall 23 of the lower cover 20. The holding part 140 of the resonator 10 is also joined to the side wall 33 of the upper cover 30. The resonator 10 is held between the lower cover 20 and the upper cover 30. The lower cover 20, the upper cover 30, and the holding part 140 of the resonator 10 define the vibration space in which the vibration part 110 vibrates. The resonator 10, the lower cover 20, and the upper cover 30 are each formed by using, for example, a silicon substrate (hereinafter referred to as an Si substrate). In some embodiments, the resonator 10, the lower cover 20, and the upper cover 30 may each be formed by using a silicon-on-insulator (SOI) substrate, which is a silicon layer with a silicon oxide film laid thereon.

Resonator 10

The vibration part 110, the holding part 140, and the holding arm 150 of the resonator 10 are integrally formed in the same process according to the exemplary embodiment. The resonator 10 includes an Si substrate F2 and a metal film E1. The Si substrate F2 is an example of the substrate, and the metal film E1 is stacked on top of the Si substrate F2. The metal film E1 is overlaid with a piezoelectric film F3, and a metal film E2 is stacked on top of the piezoelectric film F3. The metal film E2 is overlaid with a protective film F5. Each of the mass addition portions 122A to 122D includes the corresponding one of the mass addition films 125A to 125D on the protective film F5. The vibration part 110, the holding part 140, and the holding arm 150 each have a geometry obtained by patterning the multilayer body including mainly the Si substrate F2, the metal film E1, the piezoelectric film F3, the metal film E2, and the protective film F5. The multilayer body may be patterned by dry etching in which the multilayer body is exposed to argon (Ar) ion beams for removal processing.

The Si substrate F2 is, for example, a degenerate n-type silicon (Si) semiconductor having a thickness of about 6 μm and doped with n-type dopants such as phosphorus (P), arsenic (As), and antimony (Sb). The electrical resistivity of the degenerate silicon (Si) for use as the Si substrate F2 may, for example, be less than 16 mΩ·cm and is more preferably not more than 1.2 mΩ·cm. On a lower surface of the Si substrate F2 is a temperature characteristics correction layer F21, which is formed from silicon oxide such as $SiO_2$.

The temperature characteristics correction layer F21 enables, at least at or near room temperatures, a reduction in the temperature coefficient of the resonant frequency of the resonator 10, that is, a reduction in the rate of change in resonant frequency per unit temperature. The temperature characteristics correction layer F21 included in the vibration part 110 enables the resonator 10 to exhibit improved temperature characteristics. The vibration part 110 may include a temperature characteristics correction layer provided on an upper surface of the Si substrate F2 or may include temperature characteristics correction layers respectively provided on the upper and lower surfaces of the Si substrate F2.

The temperature characteristics correction layer F21 on the mass addition portions 122A to 122D desirably has a uniform thickness. It is noted that for purposes of this disclosure, the uniform thickness herein means that variations within a range of ±20% from the thickness mean value of the temperature characteristics correction layer F21 are tolerated.

The metal films E1 and E2 each include a vibration-generating electrode and an extended electrode. The vibration-generating electrode causes the vibration arms 121A to 121D to vibrate. The extended electrode electrically connects the vibration-generating electrode to an external power source or the ground potential. In the arm portions 123A to 123D of the vibration arms 121A to 121D, regions being part of the metal film E1 and functioning as the vibration-generating electrode are opposite to regions being part of the metal film E2 and functioning as the vibration-generating electrode, with the piezoelectric film F3 being located between the metal films E1 and E2. Regions functioning as the extended electrodes of the metal films E1 and E2 may, for example, extend out from the base section 130 to the holding part 140 through the holding arm 150. The metal film E1 is electrically continuous throughout the resonator 10. Regions of the metal film E2 that are included in the outer vibration arms 121A and 121D are electrically isolated from regions of the metal film E2 that are included in the inner vibration arms 121B and 121C. The metal film E1 is a lower electrode, and the metal film E2 is an upper electrode.

The thickness of each of the metal films E1 and E2 is, for example, not less than about 0.1 µm and not more than about 0.2 µm. After being formed, the metal films E1 and E2 undergo removal processing (e.g., etching) and are patterned into mainly the vibration-generating electrodes and the extended electrodes. The metal films E1 and E2 are formed from, for example, metallic materials whose crystal structure is a body-centered cubic structure. Specifically, the metal films E1 and E2 are each formed from, for example, molybdenum (Mo) or tungsten (W).

According to the exemplary aspect, the piezoelectric film F3 is a thin film formed from a piezoelectric material for converting between electrical energy and mechanical energy. In operation, the piezoelectric film F3 expands and contracts in the Y-axis direction in an X-Y plane in accordance with the electric field generated in the piezoelectric film F3 by the metal films E1 and E2. Through the expansion and contraction of the piezoelectric film F3, the open ends of the vibration arms 121A to 121D undergo displacement toward the bottom plate 22 of the lower cover 20 and displacement toward the bottom plate 32 of the upper cover 30. This means that the resonator 10 vibrates in the out-of-plane bending-vibration mode.

The piezoelectric film F3 is formed from a material having a wurtzite hexagonal crystal structure. For example, the piezoelectric film F3 includes, as a principal component, a nitride or an oxide, and more specifically, aluminum nitride (AlN), scandium aluminum nitride (ScAlN), zinc oxide (ZnO), gallium nitride (GaN), or indium nitride (InN). Scandium aluminum nitride is obtained by substituting part of aluminum in aluminum nitride with scandium. Instead of being substituted with scandium, part of aluminum in aluminum nitride may be substituted with magnesium (Mg) and niobium (Nb), with magnesium (Mg) and zirconium (Zr), or with any other two elements, for example. The piezoelectric film F3 has a thickness of about 1 µm. In some embodiments, the thickness of the piezoelectric film F3 may be in the range of about 0.2 µm to about 2 µm in alternative aspects.

The protective film F5 protects the metal film E2 from oxidation. Although it is required that the protective film F5 be on a surface of the metal film E2 that is closer than another surface of the metal film E2 to the upper cover 30, the protective film F5 does not necessarily lie open to the bottom plate 32 of the upper cover 30. The protective film F5 may be overlaid with, for example, a parasitic capacitance reduction film that reduces the capacitance of wiring of the resonator 10. The protective film F5 is a nitride film formed from aluminum nitride (AlN) or silicon nitride ($SiN_X$) or is an oxide film formed from aluminum oxide ($Al_2O_3$), tantalum pentoxide ($Ta_2O_5$), or silicon oxide ($SiO_X$).

The protective film F5 on the mass addition portions 122A to 122D desirably has a uniform thickness. For purposes of this disclosure, the uniform thickness herein means that variations within a range of ±20% from the thickness mean value of the protective film F5 are tolerated.

Each of the mass addition films 125A to 125D is a surface of the corresponding one of the mass addition portions 122A to 122D and faces the upper cover 30. Moreover, each of the mass addition films 125A to 125D is a frequency adjustment film for the corresponding one of the vibration arms 121A to 121D. The mass addition films 125A to 125D are partially removed through trimming processing for adjustment of the frequency of the resonator 10. With a view to enhancing the efficiency of frequency adjustment, it is desired that the mass addition films 125A to 125D be formed from a material whose mass reduction rate at the time of etching is faster than the mass reduction rate of the protective film F5. The mass reduction rate is obtained by multiplying the etching rate by the density. The etching rate refers to the thickness removed per unit time. Although the relationship between the mass reduction rate of the protective film F5 and the mass reduction rate of the mass addition films 125A to 125D should be as noted above, the magnitude relationship between the etching rate of the protective film F5 and the etching rate of the mass addition films 125A to 125D may be adjusted as desired. With a view to increasing the weight of the mass addition portions 122A to 122D efficiently, it is preferred that the mass addition films 125A to 125D be formed from a material of high specific gravity. For these reasons, the mass addition films 125A to 125D are formed from a metallic material such as molybdenum (Mo), tungsten (W), gold (Au), platinum (Pt), nickel (Ni), or titanium (Ti).

The process of adjusting the frequency involves trimming processing in which upper surfaces of the mass addition films 125A to 125D are partially removed. The shape of the mass addition films 125A to 125D will be specifically described later. As the trimming processing, dry etching involving radiation of argon (Ar) ion beams may be applied to the mass addition films 125A to 125D. A wide area may be radiated with ion beams, which thus provide a high degree of processing efficiency. Meanwhile, the mass addition films 125A to 125D would be electrically charged by ion beams bearing electrical charges. The vibration orbit of the vibration arms 121A to 121D would be changed due to the coulomb interaction in the electrically charged mass addition films 125A to 125D, and the vibration characteristics of the resonator 10 would degrade accordingly. To avoid such a defective condition, the mass addition films 125A to 125D are desirably grounded in the exemplary aspect.

The extended lines C1, C2, and C3 are provided on the protective film F5 on the holding part 140. As shown, the extended line C1 is electrically connected to the metal film E1 through a through-hole extending through both the piezoelectric film F3 and the protective film F5. The extended line C2 is electrically connected, through a through-hole in the protective film F5, to portions of the metal film E2 that are included in the outer vibration arms 121A and 121D. The extended line C3 is electrically connected, through a through-hole in the protective film F5, to portions of the metal film E2 that are included in the inner vibration arms 121B and 121C. The extended lines C1 to C3 are each formed from a metallic material such as aluminum (Al), germanium (Ge), gold (Au), or tin (Sn).

Lower Cover 20

According to the exemplary embodiment, the bottom plate 22 and the side wall 23 of the lower cover 20 are integrally formed of an Si substrate P10. The Si substrate P10 is formed from nondegenerate silicon and has an electrical resistivity of, for example, 10 Ω·cm or more. The Si substrate P10 lies open to the inside of the recess 21 the lower cover 20. The projection 50 has an upper surface covered with the temperature characteristics correction layer F21. With a view to inhibiting electrification of the projection 50, the Si substrate P10, whose electrical resistivity is lower than the electrical resistivity of the temperature characteristics correction layer F21, may be exposed at the upper surface of the projection 50, or an electrically conductive layer may be provided on the upper surface of the projection 50.

The thickness of the lower cover 20 in the Z-axis direction is about 150 μm, for example. Moreover, the depth of the recess 21 in the Z-axis direction is denoted by D1 and is about 100 μm. The amplitude of the vibration arms 121A to 121D is limited by the depth D1; that is, their maximum amplitude on the inner side of the lower cover 20 is about 100 μm.

The lower cover 20 may be regarded as part of the SOI substrate. With the resonator 10 and the lower cover 20 being regarded as a MEMS substrate integrally formed of the SOI substrate, the Si substrate P10 of the lower cover 20 is a support substrate of the SOI substrate, the temperature characteristics correction layer F21 of the resonator 10 is a buried oxide (BOX) layer, and the Si substrate F2 of the resonator 10 is an active layer of the SOI substrate. Part of the continuous MEMS substrate may be used to form various types of semiconductor elements and circuits on the outer portion of the resonance device 1.

Upper Cover 30

The bottom plate 32 and the side wall 33 of the upper cover 30 are integrally formed of an Si substrate Q10 in the exemplary embodiment. It is preferred that a top surface and a back surface of the upper cover 30 and inner surfaces of the through-holes be covered with a silicon oxide film Q11. The silicon oxide film Q11 is formed on a top surface of the Si substrate Q10 by, for example, oxidation of the Si substrate Q10 or chemical vapor deposition (CVD). The Si substrate Q10 lies open to the inside of the recess 31 of the upper cover 30. In addition, a getter layer may be provided on a surface of the recess 31 of the upper cover 30 in a manner so as to face the resonator 10. The getter layer is formed from, for example, titanium (Ti) or any other material with a high affinity with hydrogen and oxygen. The getter layer adsorbs gas removed from the Si substrate P10, the Si substrate Q10, and a joint part H. The decrease in the degree of vacuum in the vibration space may be minimized accordingly. Alternatively, the getter layer may be provided on a surface of the recess 21 of the lower cover 20 in a manner so as to face the resonator 10. In some embodiments, two getter layers may respectively be formed on the surface of the recess 21 of the lower cover 20 and the surface of the recess 31 of the upper cover 30 in a manner so as to face the resonator 10.

The thickness of the upper cover 30 in the Z-axis direction is about 150 μm, for example. The depth of the recess 31 in the Z-axis direction is denoted by D2 and is about 100 μm. The amplitude of the vibration arms 121A to 121D is limited by the depth D2; that is, their maximum amplitude on the inner side of the upper cover 30 is about 100 μm.

As further shown, terminals are provided on the upper surface of the upper cover 30 (i.e., the surface opposite the surface facing the resonator 10) and are denoted by T1, T2, and T3, respectively. The terminal T1 is a mounting terminal that forms a connection between the metal film E1 and the ground. The terminal T2 is a mounting terminal that forms an electrical connection between the external power source and regions of the metal film E2 that are included in the outer vibration arms 121A and 121D. The terminal T3 is a mounting terminal that forms an electrical connection between the external power source and regions of the metal film E2 that are included in the inner vibration arms 121B and 121C. The terminals T1 to T3 are formed of a metallized (base) layer of, for example, chromium (Cr), tungsten (W), or nickel (Ni) and are plated with, for example, nickel (Ni), gold (Au), silver (Ag), or copper (Cu). With a view to achieving balanced parasitic capacitance and balanced mechanical strength, a dummy terminal electrically isolated from the resonator 10 may be provided on the top surface of the upper cover 30.

The through-via electrodes V1, V2, and V3 are provided in the side wall 33 of the upper cover 30. The through-via electrode V1 forms an electrical connection between the terminal T1 and the extended line C1. The through-via electrode V2 forms an electrical connection between the terminal T2 and the extended line C2. The through-via electrode V3 forms an electrical connection between the terminal T3 and the extended line C3. The through-via electrodes V1 to V3 are through-holes extending in the Z-axis direction through the side wall 33 of the upper cover 30 and filled with an electrically conductive material. The electrically conductive material is, for example, polycrystalline silicon (Poly-Si), copper (Cu), or gold (Au).

Yet further, the joint part H (or simply joint) is provided between the side wall 33 of the upper cover 30 and the holding part 140 such that the side wall 33 of the upper cover 30 is joined to the holding part 140 of the resonator 10. The joint part H is in the form of a closed loop surrounding the vibration part 110 in the X-Y plane such that the vibration space for the resonator 10 is sealed airtight and maintained under vacuum. The joint part H is formed of a metal film obtained by eutectic bonding of, for example, an aluminum (Al) film, a germanium (Ge) film, and an aluminum (Al) film that are stacked on top of each other in the stated order. Alternatively, the joint part H may be formed of a combination of films selected, as appropriate, mainly from a gold (Au) film, a tin (Sn) film, a copper film (Cu), a titanium (Ti) film, and a silicon (Si) film. The joint part H may contain metallic compounds such as titanium nitride (TiN) and tantalum nitride (TaN) to offer enhanced adhesion.

Operations

In operation of the present embodiment, the terminal T1 is grounded, and alternating voltages opposite in phase are applied to the terminals T2 and T3, respectively. The electric field generated in the piezoelectric film F3 in the outer vibration arms 121A and 121D and the electric field generated in the piezoelectric film F3 in inner vibration arms 121B and 121C are thus opposite in phase. Consequently, the vibration of the outer vibration arms 121A and 121D and the vibration of the inner vibration arms 121B and 121C are opposite in phase. When, for example, the mass addition portion 122A of the outer vibration arm 121A and the mass addition portion 122D of the outer vibration arm 121D undergo displacement toward an inner surface of the upper cover 30, the mass addition portion 122B of the inner vibration arm 121B and the mass addition portion 122C of the vibration arm 121C undergo displacement toward the inner surface of the lower cover 20. That is, the vibration arm 121A and the vibration arm 121B, which are adjacent to each other, vibrate vertically in mutually opposite directions about a central axis r1 extending in the Y-axis direction between the vibration arm 121A and the vibration arm 121B. Similarly, the vibration arm 121C and the vibration arm 121D, which are adjacent to each other, vibrate vertically in mutually opposite directions about a central axis r2 extending in the Y-axis direction between the vibration arm 121C and the vibration arm 121D. With the direction of twisting moment on the central axis r1 and the direction of twisting moment on the central axis r2 being opposite to each other, the base section 130 is bent and vibrates. The vibration arms 121A to 121D vibrate in a range of about 100 μm at the maximum and vibrate in a range of about 10 μm under normal driving conditions.

When the resonance device 1 is in operation, the vibration arms 121A to 121D vibrate in the main or primary mode, whereas the left holding arm 151A and the right holding arm 151B vibrate in the spurious mode. The reason is that the left holding arm 151A and the right holding arm 151B are each provided with extended electrodes being part of the metal films E1 and E2, and electric fields are thus formed in the left holding arm 151A and the right holding arm 151B when the resonance device 1 is in action. For example, the piezoelectric film F3 in the holding arm 150 extends and contracts in accordance with the electric fields applied to the extended electrodes such that the holding arm 150 vibrates in the spurious mode. Fm denotes the frequency of the main mode in the vibration arms 121A to 121D, and Fs denotes the frequency of the spurious mode in the holding arm 150. Thus, the holding arm 150 can be configured to vibrate in the spurious mode without application of electric fields on the piezoelectric film in the holding arm 150. For example, vibration of the vibration part 110 can propagate to the holding arm 150, which in turn vibrates in the spurious mode.

Frequency Ratio

Figure 6:
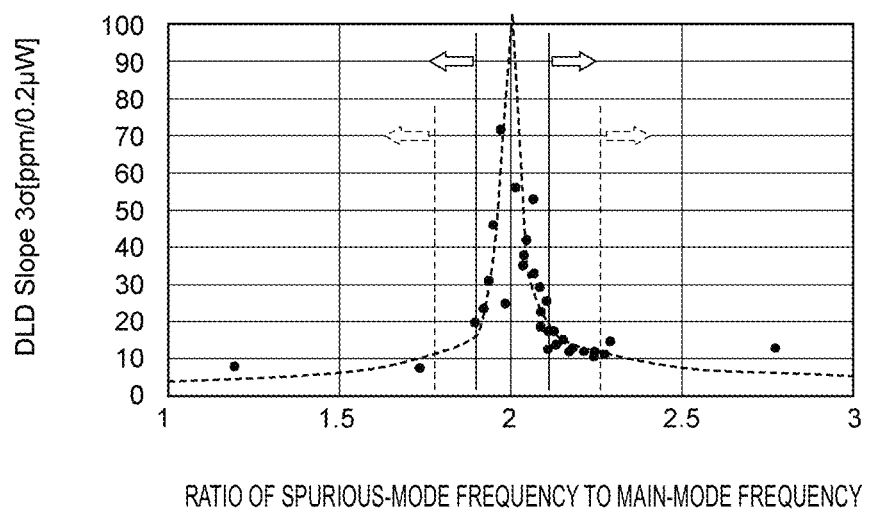
FIG. 6 is a graph illustrating the relationship between the frequency ratio and variations in drive level dependency (DLD).

The following describes, with reference to FIG. 6, the relationship between the ratio of the spurious-mode frequency to the main-mode frequency and the drive level dependency (DLD) characteristics. FIG. 6 is a graph illustrating the relationship between the frequency ratio and variations in DLD. Referring to FIG. 6, values (Fs/Fm) obtained by dividing the spurious-mode frequency by the main-mode frequency are plotted along the horizontal axis of the graph, and values (DLD Slope3σ) reflecting variations in DLD are plotted along the vertical axis of the graph.

As the value of Fs/Fm becomes closer to 2, the DLD Slope3σ, the DLD slope3σ significantly increases and takes a turn for the worse. The DLD Slope3σ within a range where 1.8≤Fs/Fm≤2.2 is greater than the DLD Slope3σ within a range where Fs/Fm<1.8 and is greater than the DLD Slope3σ within a range where 2.2<Fs/Fm. As shown, the DLD Slope 3σ within a range where 1.9≤Fs/Fm≤2.1 is much greater. Referring to FIG. 6, the DLD Slope3σ within the range where 1.8≤Fs/Fm≤2.2 is greater than 10 ppm/0.2 μW. The DLD Slope3σ within the range where 1.9≤Fs/Fm≤2.1 is greater than 20 ppm/0.2 μW. Fs and Fm desirably satisfy the inequality Fs/Fm<1.9 or the inequality 2.1<Fs/Fm and more desirably satisfy the inequality Fs/Fm<1.8 or the inequality 2.2<Fs/Fm. Where the range in FIG. 6 is concerned, Fs and Fm desirably satisfy the inequality 1.0<Fs/Fm<1.9 or the inequality 2.1<Fs/Fm<3.0 and more desirably satisfy the inequality 1.0<Fs/Fm<1.8 or the inequality 2.2<Fs/Fm<3.0. As the value of Fs/Fm becomes closer to 1 or 3, where Fs is an integer multiple of Fm, the DLD Slope3σ increases just as is the case with FIG. 6 in which Fs/Fm is equal to or close to 2. Fs and Fm desirably satisfy the inequality 1.1<Fs/Fm<2.9 and more desirably satisfy the inequality 1.2<Fs/Fm<2.8.

The degree of change in the gradient of the approximate curve within a range where 1.8≤Fs/Fm≤2.2 is higher than the degree of change in the gradient of the approximate curve within a range where Fs/Fm<1.8 and is likewise higher than the degree of change in the gradient of the approximate curve within a range where 2.2<Fs/Fm. The degree of change in the gradient of the approximate curve within a range where 1.9≤Fs/Fm≤2.1 is much higher. The gradient of the approximate curve herein for purposes of this disclosure refers to the amount of change in DLD Slope 3σ relative to the amount of change in Fs/Fm. In other words, where 1.8≤Fs/Fm≤2.2, changes of Fm or Fs that are due to device-to-device variations produced by nonuniformity in the thickness of the piezoelectric film F3 cause a considerable amount of change in DLD Slope3σ. The allowable ranges of Fs and Fm for satisfying the inequality 1.8≤Fs/Fm≤2.2 are narrower than the allowable ranges of Fs and Fm for satisfying the inequality Fs/Fm<1.8 and are narrower than the allowable ranges of Fs and Fm for satisfying the inequality 2.2<Fs/Fm. Thus, Fs and Fm desirably satisfy the inequality Fs/Fm<1.9 or the inequality 2.1<Fs/Fm and more desirably satisfy the inequality Fs/Fm<1.8 or the inequality 2.2<Fs/Fm, thus making the demands on processing accuracy less stringent and minimizing the reduction in yield accordingly.

First Example

Figure 7:
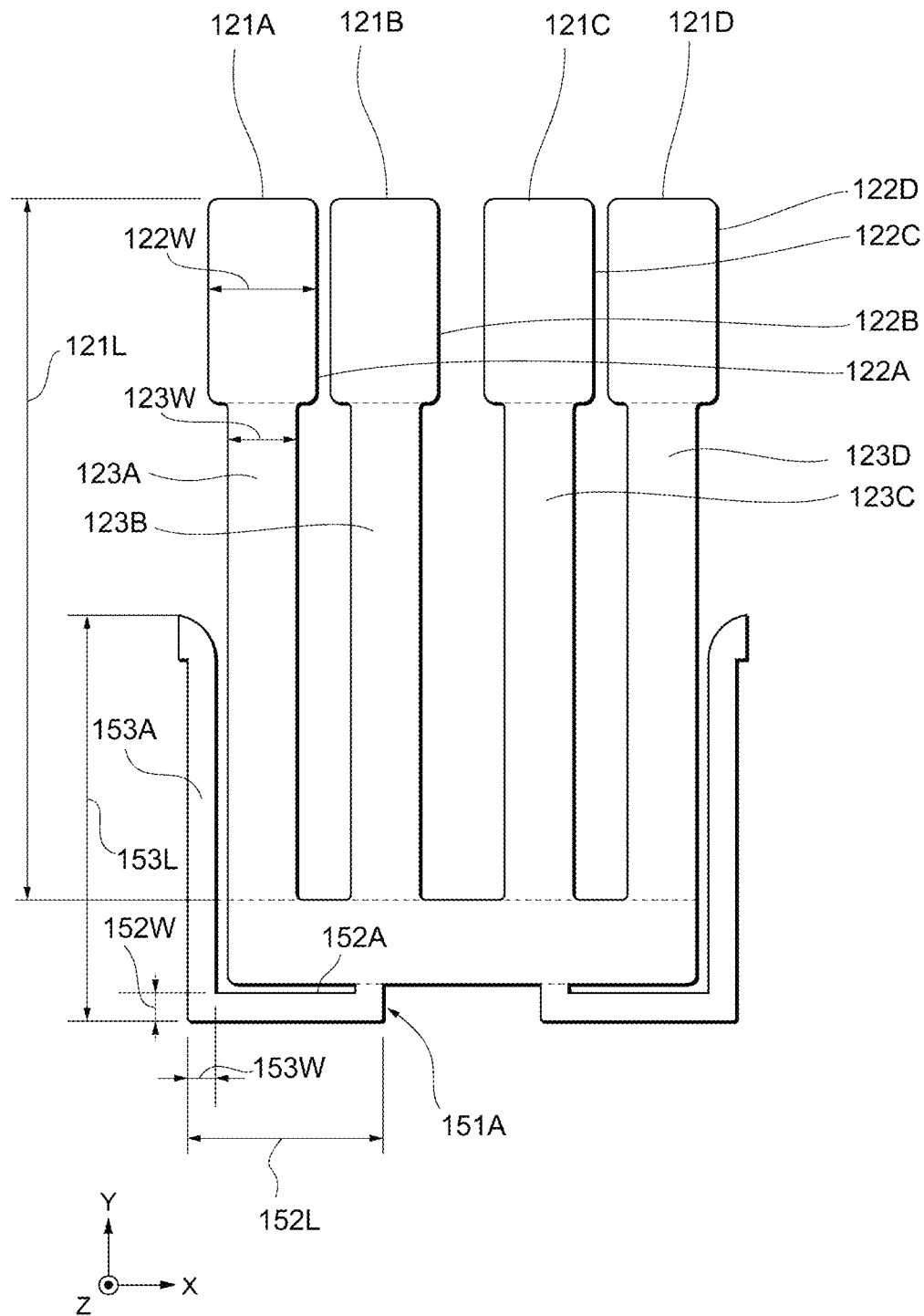
FIG. 7 is a plan view of vibration arms and holding arms, schematically illustrating the dimensions of the vibration arms and the dimensions of the holding arms.
Figure 8:
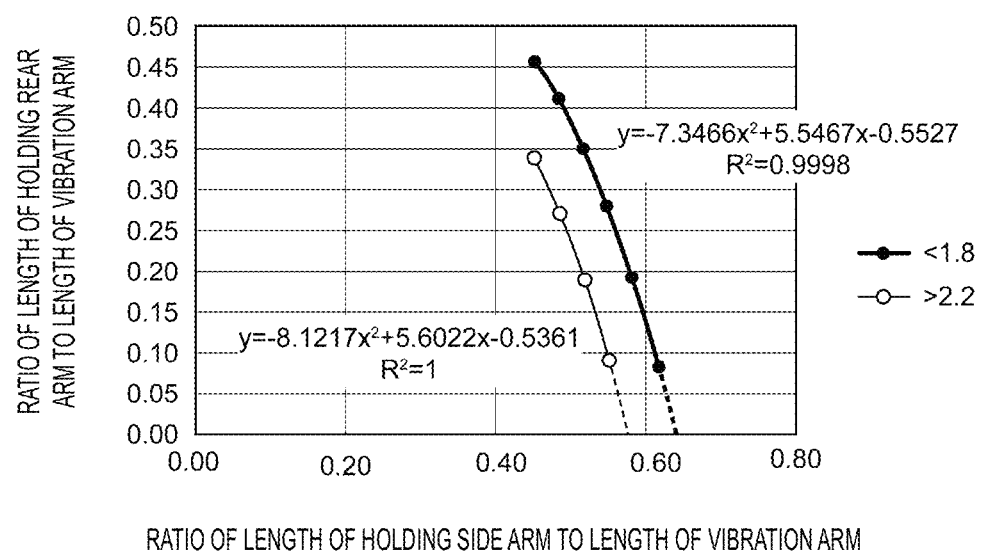
FIG. 8 is a graph illustrating the relationship between the length of a holding side arm and the length of a holding rear arm in a first example.

The following describes a first example with reference to FIGS. 7 and 8. FIG. 7 is a plan view of vibration arms and holding arms, schematically illustrating the dimensions of the vibration arms and the dimensions of the holding arms. FIG. 8 is a graph illustrating the relationship between the length of a holding side arm and the length of a holding rear arm in the first example. Referring to FIG. 8, values obtained by dividing the length of the holding side arm by the length of the vibration arm are plotted along the horizontal axis of the graph, and values obtained by dividing the length of the holding rear arm by the length of the vibration arm are plotted along the vertical axis of the graph. The vibration arms 121A to 121D all have substantially the same dimensions. For this reason, the dimensions of the vibration arm 121A will be described below, and no mention will be made of the dimensions of each of the vibration arms 121B to 121D. The left holding arm 151A and the right holding arm 151B have substantially the same dimensions. For this reason, the dimensions of the left holding arm 151A will be described below, and no mention will be made of the dimensions of the right holding arm 151B.

Referring to FIG. 7, the length of the vibration arm 121A in the Y-axis direction is denoted by 121L. The width of the mass addition portion 122A of the vibration arm 121A in the X-axis direction is denoted by 122W, the width of the arm portion 123A of the vibration arm 121A in the X-axis direction is denoted by 123W. The length 121L is the length of the region extending from the fixed end to the open end of the vibration arm 121A. The width 122W is the width of the region between two edges being on opposite sides of the mass addition portion 122A in the X-axis direction and extending in the Y-axis direction. The width 123W is the width of the region between two edges being on opposite sides of the arm portion 123A in the X-axis direction and extending in the Y-axis direction.

Moreover, the length of the holding rear arm 152A of the left holding arm 151A in the X-axis direction is denoted by 152L, and the width of the holding rear arm 152A in the Y-axis direction is denoted by 152W. The length of the holding side arm 153A of the left holding arm 151A in the Y-axis direction is denoted by 153L, and the width of the holding side arm 153A in the X-axis direction is denoted by 153W. The length 152L is the length of the region that extends from an edge to another edge of the holding rear arm 152A, or more specifically, the length of the region that extends from the edge facing the right frame 141D to the edge facing the left frame 141C. The width 152W is the width of the region being part of the holding rear arm 152A and extending in the X-axis direction, or more specifically, the width of the region defined by two edges being on opposite sides of the holding rear arm 152A in the Y-axis direction and extending in the X-axis direction. The length 153L is the length of the region extending from an edge to another edge of the holding side arm 153A, or more specifically, the length of the region that extends from the edge facing the front frame 141A to the edge facing the rear frame 141B. The width 153W is the width of the region being part of the holding side arm 153A and extending in the Y-axis direction, or more specifically, the width of the region between two edges being on opposite sides of the holding side arm 153A in the X-axis direction and extending in the Y-axis direction.

The width 122W is greater than the width 123W. The width 152W is substantially equal to the width 153W and is smaller than the width 123W. The length 153L is greater than the length 152L and is smaller than the length 121L.

The dimensions in the first example are as follows. The width 122W is about 70 μm. The width 123W is about 50 μm. The length 121L is about 465 μm. The length 152L is about 35 μm. The length 153L is about 225 μm. The widths 152W and 153W are each about 20 μm.

The specifics of the first example are as follows. The temperature characteristics correction layer F21 is formed from silicon oxide and has a thickness of about 470 nm. Moreover, the Si substrate F2 has a thickness of about 6,000 nm. The metal film E1 is formed from Mo and has a thickness of about 200 nm. The Si substrate F2 and the metal film E1 (see FIGS. 4 and 5) are laid with an AlN film (not illustrated) therebetween. The AlN film has a thickness of about 20 nm. The piezoelectric film F3 is formed from AlN. The piezoelectric film F3 included in the arm portion 123A of the vibration arm 121A has a thickness of about 800 nm. The metal film E2 is formed from Mo and has a thickness of about 100 nm. The protective film F5 is formed from AlN. The protective film F5 included in the arm portion 123A of the vibration arm 121A has a thickness of about 170 nm. The sum of the thicknesses of the piezoelectric film F3 and the protective film F5 that are formed from AlN and included in the mass addition portion 122A of the vibration arm 121A is about 1,040 nm. The mass addition film 125A of the vibration arm 121A is formed from Mo and has a thickness of about 300 nm.

In this case, the inequality 2.2<Fs/Fm holds, and the resonator thus has favorable DLD characteristics. Let L be a variable representing the length 121L of the vibration arm 121A, where 465 μm is an example value of the length 121L. Moreover, La can be a variable representing the length 153L of the holding side arm 153A, where 225 μm is an example value of the length 153L. Lb can be a variable representing the length 152L of the holding rear arm 152A, where 35 μm is an example value of the length 152L. Referring to FIG. 8, points at which the equation Fs/Fm=1.8 holds and points at which the equation Fs/Fm=2.2 holds are plotted on the graph whose vertical axis is Lb/L and whose horizontal axis is La/L. According to the approximate curve for the points at which the equation Fs/Fm=1.8 holds and the approximate curve for the points at which the equation Fs/Fm=2.2 holds, Lb/L and La/L can be expressed as follows.

The equation Fs/Fm=1.8 holds if $Lb/L=-7.3466\times(La/L)^2+5.5467\times(La/L)-0.5527$. The equation Fs/Fm=2.2 holds if $Lb/L=-8.1217\times(La/L)^2+5.6022\times(La/L)-0.5361$. Therefore, the inequality Fs/Fm<1.8 holds if $Lb/L>-7.3466\times(La/L)^2+5.5467\times(La/L)-0.5527$, and the inequality 2.2<Fs/Fm holds if $Lb/L<-8.1217\times(La/L)^2+5.6022\times(La/L)-0.5361$.

Second Example

Figure 9:
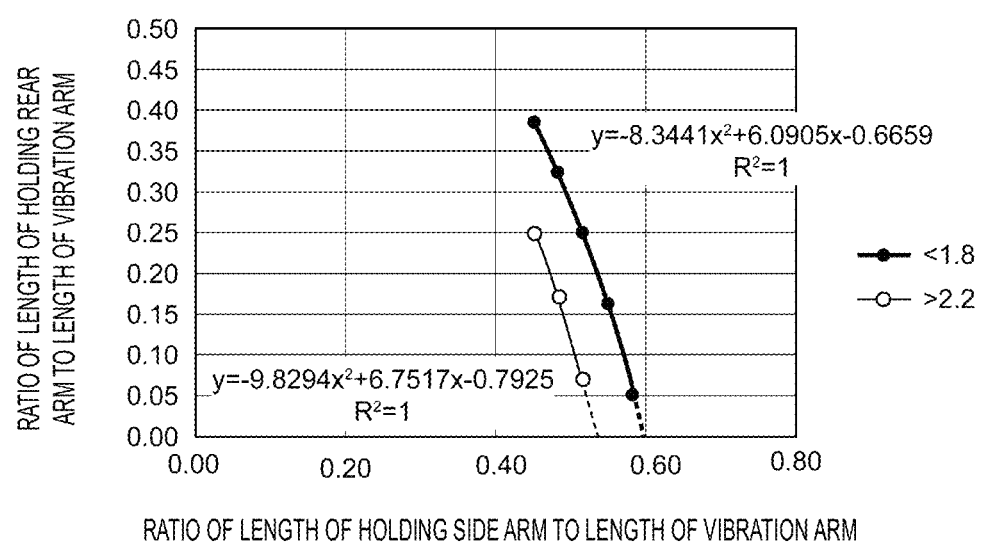
FIG. 9 is a graph illustrating the relationship between the length of a holding side arm and the length of a holding rear arm in a second example.

The following describes a second example with reference to FIG. 9. FIG. 9 is a graph illustrating the relationship between the length of a holding side arm and the length of a holding rear arm in the second example. The horizontal axis and the vertical axis of the graph in FIG. 9 are identical to the respective axes of the graph in FIG. 8.

The second example differs from the first example in that the width 122W of the mass addition portion 122A and the width 123W of the arm portion 123A are both about 50 μm. According to FIG. 9 with the approximate curve for the points at which the equation Fs/Fm=1.8 holds and the approximate curve for the points at which the equation Fs/Fm=2.2 holds, Lb/L and La/L can be expressed as follows.

The equation Fs/Fm=1.8 holds if $Lb/L=-8.3441\times(La/L)^2+6.0905\times(La/L)-0.6659$. The equation Fs/Fm=2.2 holds if $Lb/L=-9.8294\times(La/L)^2+6.7517\times(La/L)-0.7925$. Therefore, the inequality Fs/Fm<1.8 holds if $Lb/L>-8.3441\times(La/L)^2+6.0905\times(La/L)-0.6659$, and the inequality 2.2<Fs/Fm holds if $Lb/L<-9.8294\times(La/L)^2+6.7517\times(La/L)-0.7925$.

The inequality Fs/Fm<1.9 or the inequality 2.1<Fs/Fm holds in the present embodiment, which can thus minimize the increase in variations in DLD. The increase in variations in DLD may be further minimized especially when the inequality Fs/Fm<1.8 or the inequality 2.2<Fs/Fm holds.

The holding side arms 153A and 153B of the holding arm 150, respectively, are connected to the left frame 141C and the right frame 141D of the holding part 140. The frequency of the spurious mode may thus be adjustable by changes in the design of the holding side arms 153A and 153B. The high degree of flexibility in the design of the holding arm 150 increases the possibility that the value of Fs/Fm will become close to 2. Satisfying the relevant conditional expressions for Fs/Fm by means of design is an important factor in providing resonators having favorable DLD characteristics.

The holding side arms 153A and 153B, respectively, are connected to the left frame 141C and the right frame 141D in such a manner that the junction between the holding side arm 153A and the left frame 141C and the junction between the holding side arm 153B and the right frame 141D are aligned with each other, with the arm portions 123A to 123D lying between the junctions. Moreover, the mass addition portions 122A and 122D, each of which is wider than the corresponding one of the arm portions 123A and 123D, are not aligned with the holding side arms 153A and 153B in the X-axis direction. This layout and configuration enables a reduction in the dimension of the resonator 10 in the X-axis direction.

The following describes the configuration of resonators according to additional embodiments of the present invention. Description of features common to the first embodi-

Second Exemplary Embodiment

Figure 10:
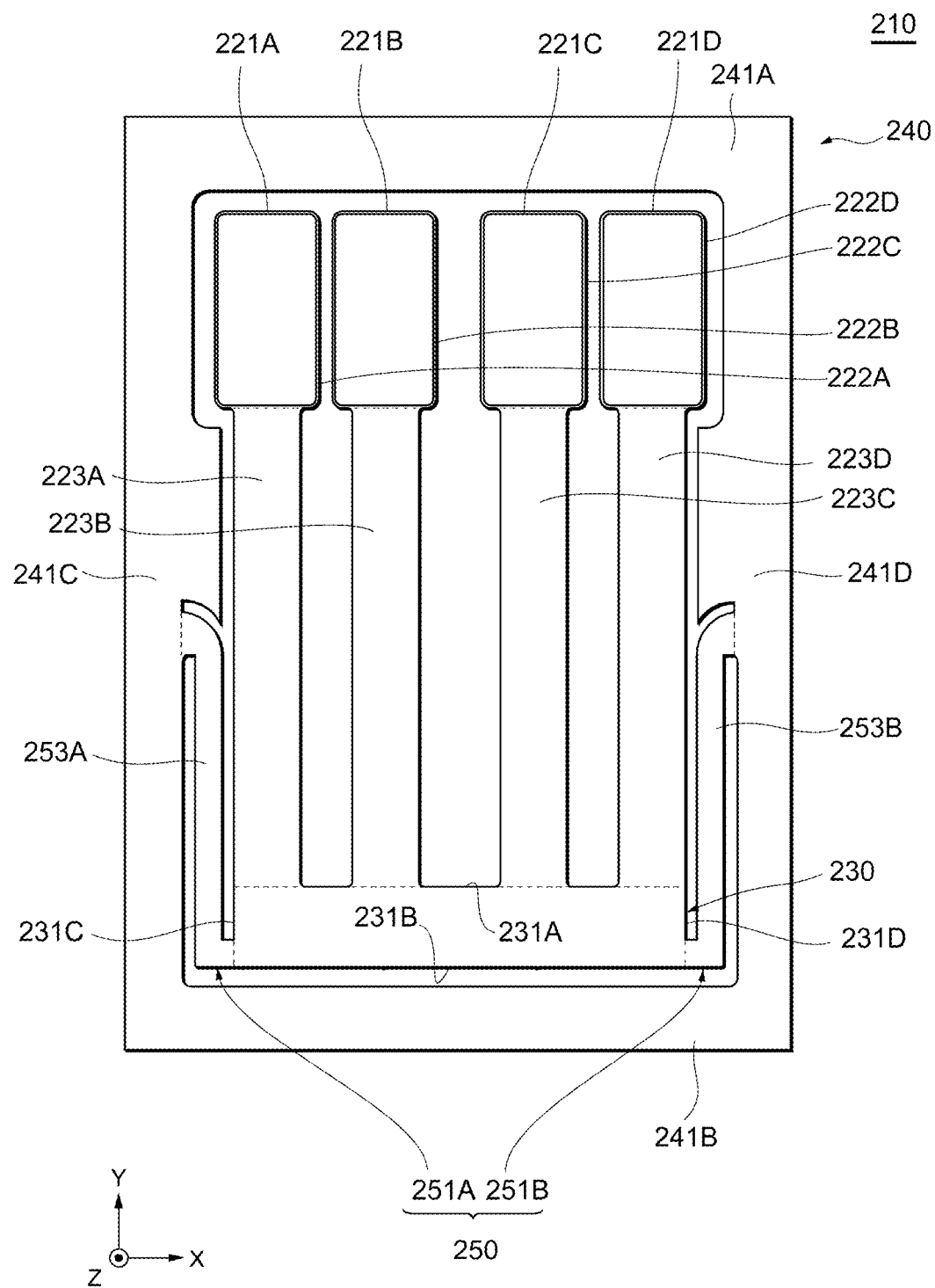
FIG. 10 is a plan view of a resonator according to a second exemplary embodiment, schematically illustrating the structure of the resonator.

The following describes a resonator 210 according to a second exemplary embodiment with reference to FIG. 10. FIG. 10 is a plan view of a resonator according to the second embodiment, schematically illustrating the structure of the resonator.

As with the resonator according to the first embodiment, the resonator 210 according to the second embodiment includes vibration arms, a base section, a holding part, and a holding arm. The vibration arms are denoted by 221A to 221D. The base section, the holding part, and the holding arm are denoted by 230, 240, and 250, respectively. The vibration arms 221A to 221D include their respective mass addition portions, which are denoted by 222A to 222D, and also include their respective arm portions, which are denoted by 223A to 223D. The base section 230 includes a front end portion 231A, a rear end portion 231B, a left end portion 231C, and a right end portion 231D. The holding part 240 includes a front frame 241A, a rear frame 241B, a left frame 241C, and a right frame 241D. The holding arm 250 includes a left holding arm 251A and a right holding arm 251B.

The second embodiment differs from the first embodiment in that the left holding arm 251A and the right holding arm 251B, respectively, are connected to the left end portion 231C and the right end portion 231D of the base section 230. Specifically, the left holding arm 251A extends toward the left frame 241C from the left end portion 231C, is bent to extend toward the front frame 241A, and is bent to extend toward the left frame 241C. The right holding arm 251B extends toward the right frame 241D from the right end portion 231D, is bent to extend toward the front frame 241A, and is bent to extend toward the right frame 241D. This means that the left holding arm 251A and the right holding arm 251B do not include their respective holding rear arms. The left holding arm 251A and the right holding arm 251B include their respective holding side arms, which are denoted by 253A and 253B.

Effects similar to those of the aforementioned resonator may be attained in the present embodiment.

Figure 11:
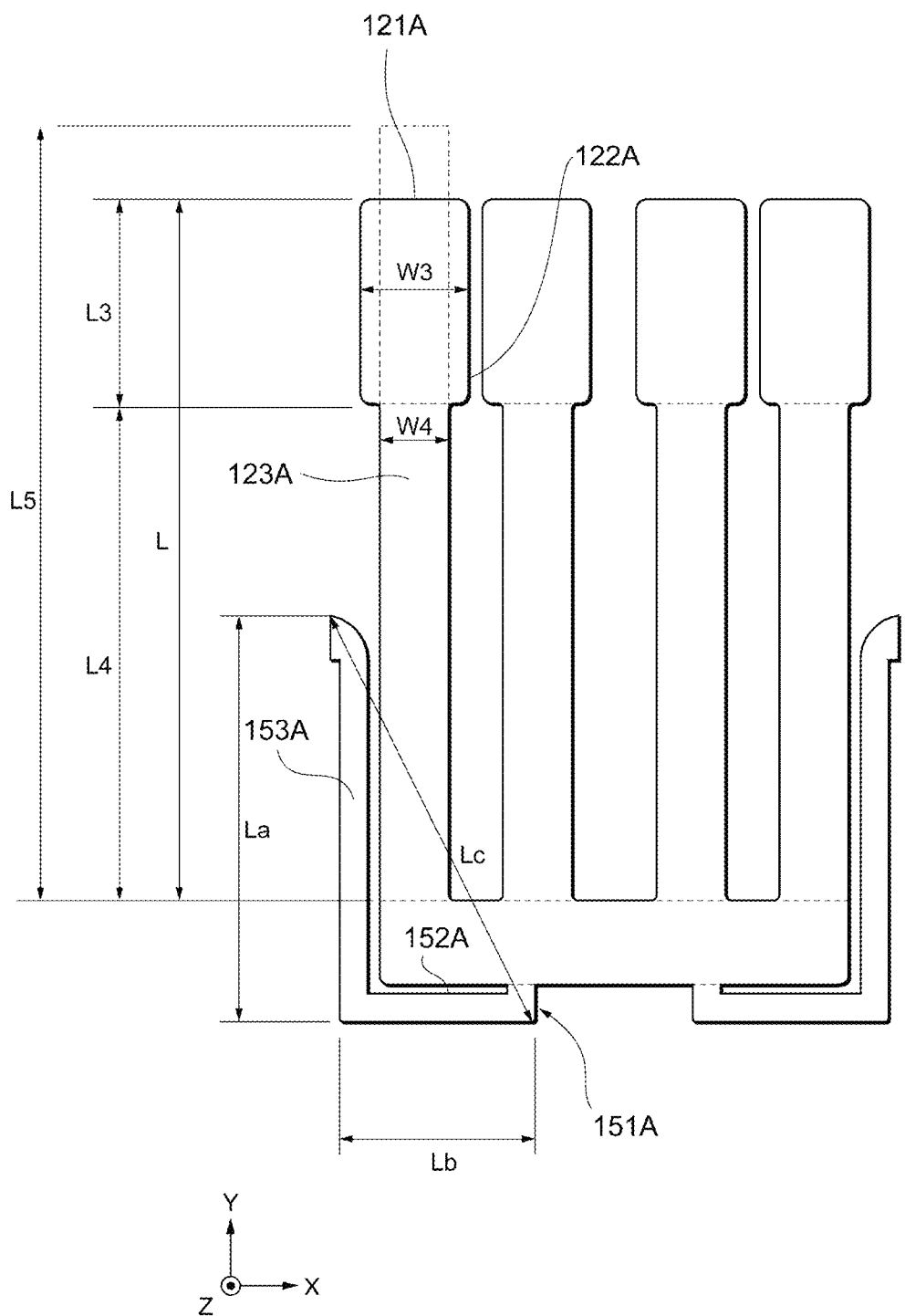
FIG. 11 illustrates vibration arms and holding arms for the sake of making explanation of the dimensions of the vibration arms and the dimensions of the holding arms.
Figure 12:
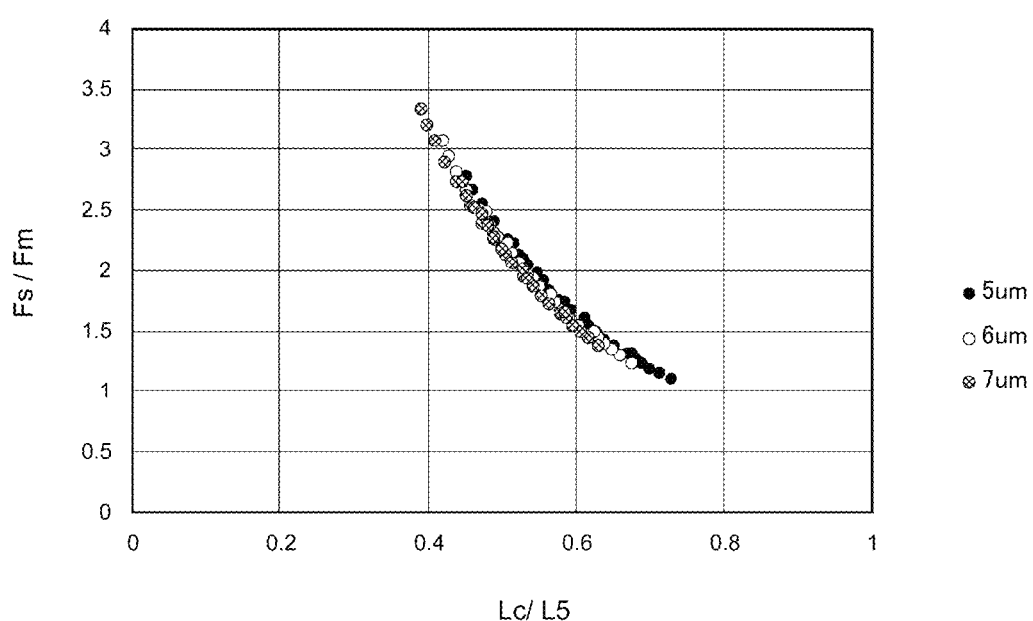
FIG. 12 is a graph illustrating the relationship between the frequency and the ratio of the dimension of a holding arm to the dimension of a vibration arm.
Figure 13:
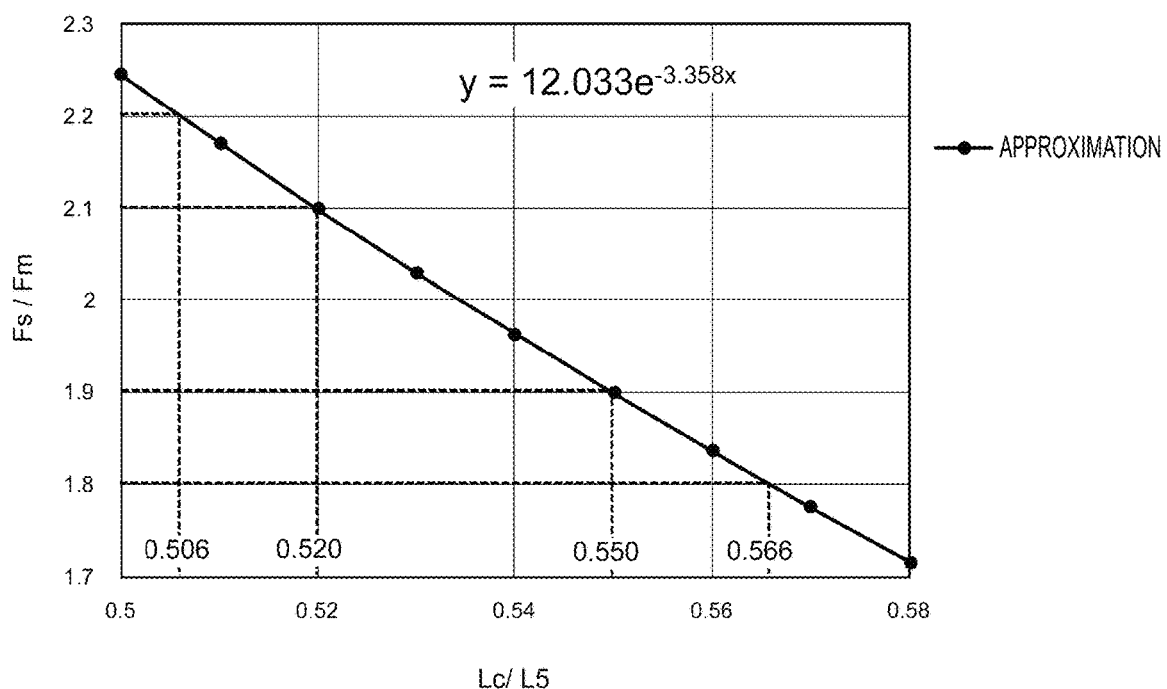
FIG. 13 is a graph with an approximate curve for the frequency ratio.

The following describes the relationship between the dimensional ratio and the frequency ratio with reference to FIGS. 11 to 13. FIG. 11 illustrates vibration arms and holding arms for the sake of making explanation of the dimensions of the vibration arms and the dimensions of the holding arms. FIG. 12 is a graph illustrating the relationship between the frequency and the ratio of the dimension of a holding arm to the dimension of a vibration arm. FIG. 13 is a graph with an approximate curve for the frequency ratio. The following describes, with reference to FIG. 11, the dimensions of the left holding arm 151A, which is a representative of the holding arms, and describes the dimensions of the vibration arm 121A, which is a representative of the vibration arms. It should be appreciated that the left holding arm 151A and the right holding arm 151B are structurally mirror images of each other and have substantially the same dimensions. For this reason, no mention will be made of the dimensions of the right holding arm 151B. Similarly, no mention will be made of the dimensions of each of the vibration arms 121B to 121D, which are each substantially identical in dimensions to the vibration arm 121A.

Referring to FIG. 11, La denotes the length of the holding side arm 153A, Lb denotes the length of the holding rear arm 152A, and Lc denotes the distance from an edge to another edge of the left holding arm 151A. As described with reference to FIG. 7, the length La is the length of the region extending from an edge to another edge of the holding side arm 153A, or more specifically, the length of the region extending from the edge on the +Y side to the edge on the −Y side in the Y-axis direction, that is, the length of the region that extends from the edge facing the front frame 141A to the edge facing the rear frame 141B. The length Lb is the length of the region extending from an edge to another edge of the holding rear arm 152A, or more specifically, the length of the region extending from the edge on the +X side to the edge on the −X side in the X-axis direction, that is, the length of the region that extends from the edge facing the right frame 141D to the edge facing the left frame 141C. The distance Lc is the distance between an edge farther than any other edge of the holding rear arm 152A from the holding side arm 153A and an edge father than any other edge of the holding side arm 153A from the holding rear arm 152A. More specifically, the distance Lc is the distance between two corners. One of the corners is on an edge farther than any other edge of the holding rear arm 152A from the holding side arm 153A and is on the +X side in the X-axis direction and on the −Y side in the Y axis direction. The other corner is on an edge farther than any other edge of the holding side arm 153A from the holding rear arm 152A and is on the −X side in the X-axis direction and on the +Y side in the Y axis direction. In other words, the distance Lc is the distance between the corner being part of the holding rear arm 152A and facing both the right frame 141D and the rear frame 141B and the corner being part of the holding side arm 153A and facing both the front frame 141A and the left frame 141C.

As shown, the holding rear arm 152A and the holding side arm 153A in the present embodiment are connected to each other in a manner so as to form a right angle, and the distance Lc can be written as the square root of the sum of the square of the length La and the square of the length Lb and can be expressed by the following equation:

$$Lc = \sqrt{La^2 + Lb^2}$$

Referring to FIG. 11, L denotes the length of the vibration arm 121A, L3 denotes the length of the mass addition portion 122A of the vibration arm 121A, W3 denotes the width of the mass addition portion 122A, L4 denotes the length of the arm portion 123A of the vibration arm 121A, W4 denotes the width of the arm portion 123A, and L5 denotes equivalent vibration arm length. The equivalent vibration arm length L5 is the length of an imaginary vibration arm of constant width. The imaginary vibration arm is obtained by transforming the vibration arm 121A into a form whose moment of inertia is equal to the moment of inertia of the vibration arm 121A. The frequency of the vibration arm is dependent on the moment of inertia. For the sake of comparisons between vibration arms including mass addition portions of different lengths and/or different widths, the vibration arm 121A is transformed into an imaginary arm whose width is equal to the width W4 of the arm portion 123A, and the length of the imaginary vibration arm is herein referred to as the equivalent vibration arm length L5.

The moment of inertia of a plate can be expressed as follows:

$$I \propto \int_0^L W(x) * x^2 dx$$

where I is the moment of inertia, x is the distance from the fixed end of the vibration arm, and W(x) is the width of the vibration arm at the distance x.

The moment of inertia of the vibration arm 121A can be expressed as follows:

$$I \propto \int_0^{L4} W4 * x^2 dx + \int_{L4}^{L} W3 * x^2 dx = W4 * \tfrac{1}{3} * (L4)^3 + W3 * \tfrac{1}{3} * \{(L^3 - (L4)^3)\}$$

The moment of inertia of the imaginary vibration arm of constant width can be expressed with the equivalent vibration arm length L5 as follows:

$$I \propto \int_0^{L5} W4 * x^2 dx = W4 * \tfrac{1}{3} * (L5)^3$$

The moment of inertia of the vibration arm 121A is equal to the moment of inertia of the imaginary vibration arm having the equivalent vibration arm length L5, and the equivalent vibration arm length L5 can thus be determined by using the following equation:

$$W4 * \tfrac{1}{3} * (L4)^3 + W3 * \{(L^3 - (L4)^3)\} = W4 * \tfrac{1}{3} * (L5)^3$$

Figure 14:
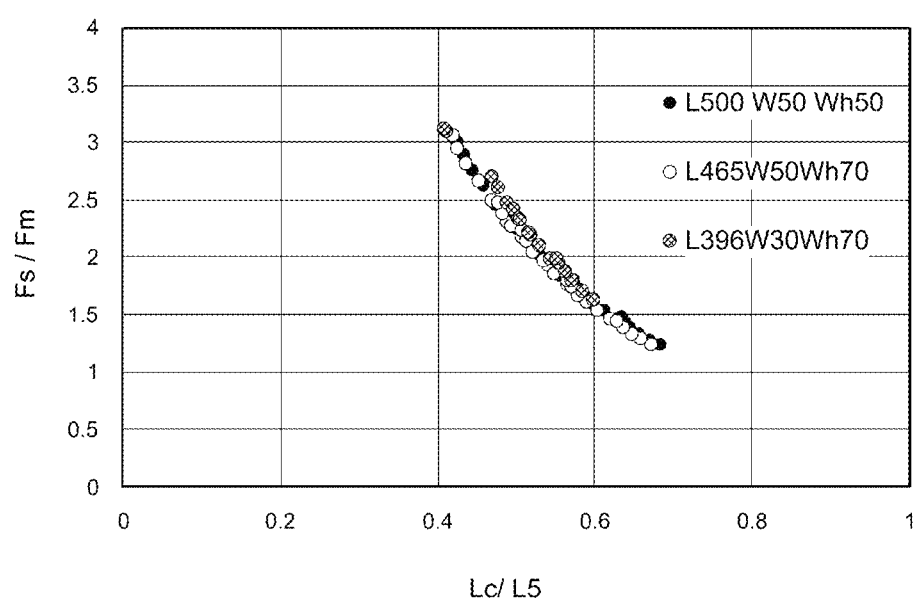
FIG. 14 is a graph illustrating changes in the frequency ratio that result from changes in the shape of the vibration arm.

Referring to FIGS. 12 to 14, the horizontal axis of each graph represents the ratio of the distance Lc (i.e., the distance from an edge to another edge of the holding arm) to the equivalent vibration arm length L5, and this dimensional ratio is expressed as Lc/L5. The vertical axis of each graph represents the ratio of the spurious-mode frequency Fs to the main-mode frequency Fm, and this frequency ratio is expressed as Fs/Fm.

FIG. 12 illustrates the relationship between the dimensional ratio and the frequency ratio that were determined through simulation conducted on vibration arms with variations in the thickness of the Si substrate F2. The length L of each of the vibration arms was adjusted such that the main-mode frequency Fm was consistent across all samples. The samples used in the simulation were made in accordance with the first example of the first embodiment, with L=431 μm for the Si substrate F2 having a thickness of 5 μm, L=465 μm for the Si substrate F2 having a thickness of 6 μm, and L=498 μm for the Si substrate F2 having a thickness of 7 μm. The dimensional ratio Lc/L5 and the frequency ratio Fs/Fm of the individual samples were calculated and plotted on the graph. The simulation revealed that the correlation between the dimensional ratio Lc/L5 and the frequency ratio Fs/Fm followed the same pattern irrespective of sample-to-sample variations in the thickness of the Si substrate F2 and in the length L of the vibration arms.

The curve drawn on FIG. 13 is based on an approximate equation obtained from all the plots on the graph in FIG. 12. The approximate equation is shown in the graph, where y represents the vertical axis and x represents the horizontal axis. As can be seen from the graph, the inequality Fs/Fm<1.9 holds if 0.550<Lc/L5, and the inequality 2.1<Fs/Fm holds if Lc/L5<0.520. The inequality Fs/Fm<1.8 holds if 0.566<Lc/L5, and the inequality 2.2<Fs/Fm holds if Lc/L5<0.506. For minimization of the increase in variations in DLD, Lc and L5 desirably satisfy the inequality Lc/L5<0.520 or the inequality 0.550<Lc/L5 and more desirably satisfy the inequality Lc/L5<0.506 or the inequality 0.566<Lc/L5.

The preferable ranges for Lc/L5 remain unchanged irrespective of any difference in the dimensions of the arm portions and the dimensions of the mass addition portions. This can be seen from the graph in FIG. 14. FIG. 14 illustrates the relationship between the dimensional ratio Lc/L5 and the frequency ratio Fs/Fm that were determined through simulation conducted on vibration arms with variations in the dimensions of the arm portions and in the dimensions of the mass addition portions. The length L of each of the vibration arms was adjusted such that the main-mode frequency Fm was consistent across all samples. The annotation saying "L500 W50 Wh50" refers to results obtained from simulation conducted on a sample that included vibration arms each having a length of 500 μm and including a 50-μm-wide arm portion and a 50-μm-wide mass addition portion. The annotation saying "L465 W50 Wh70" refers to results obtained from simulation conducted on a sample that included vibration arms each having a length of 465 μm and including a 50-μm-wide arm portion and a 70-μm-wide mass addition portion. The annotation saying "L396 W30 Wh70" refers to results obtained from simulation conducted on a sample that included vibration arms each having a length of 396 μm and a 30-μm-wide arm portion and a 70-μm-wide mass addition portion. Under these conditions, the ratio of the length of the mass addition portion to the length of the vibration arm stood at 36%.

Plots under the condition "L500 W50 Wh50" and plots under the condition "L465 W50 Wh70" can be approximated by substantially the same curve. This means that the correlation between the dimensional ratio Lc/L5 and the frequency ratio Fs/Fm followed substantially the same pattern irrespective of sample-to-sample variations in the width of the mass addition portion. The plots under the condition "L465 W50 Wh70", the plots under the condition "L500 W50 Wh50", and plots under the condition "L396 W30 Wh70" can be approximated by substantially the same curve. This means that the correlation between the dimensional ratio Lc/L5 and the frequency ratio Fs/Fm followed substantially the same pattern irrespective of sample-to-sample variations in the width of the arm portion.

In general, exemplary embodiments of the present invention will be described, in part or in whole, as follows. The following description should not be construed as limiting the scope of the present invention.

An exemplary aspect provides a resonator that includes a base, at least one vibration arm, a frame, and a holding arm. The at least one vibration arm includes a piezoelectric film, an upper electrode, and a lower electrode. The upper and lower electrodes are laid on opposite sides with the piezoelectric film therebetween. The at least one vibration arm has a fixed end connected to a front end of the base and an open end located away from the front end. The frame holds the base section. The holding arm forms a connection between the base and the frame. The inequality Fs/Fm<1.9 or the inequality 2.1<Fs/Fm holds, where Fm is the frequency of a main mode in the at least one vibration arm, and Fs is the frequency of a spurious mode in the holding arm.

This configuration enables minimization of the increase in variations in DLD.

In another aspect, the inequality Fs/Fm<1.8 or the inequality 2.2<Fs/Fm holds for the resonator.

This configuration enables further minimization of the increase in variations in DLD.

Still another aspect is as follows. The holding arm includes a holding rear arm and a holding side arm. The holding rear arm is connected to a rear end portion opposite the front end of the base and extends along the rear end. The holding side arm is connected to the holding rear arm and extends along the at least one vibration arm. The inequality Lc/L5<0.520 or the inequality 0.550<Lc/L5 holds, where Lc is the distance between an edge farther than any other edge of the holding rear arm from the holding side arm and an edge farther than any other edge of the holding side arm from the holding rear arm, and L5 is the length of an imaginary vibration arm of constant width. The imaginary vibration arm is obtained by transforming the at least one vibration arm into a form whose moment of inertia is equal to the moment of inertia of the at least one vibration arm.

In still another aspect, the inequality Lc/L5<0.506 or the inequality 0.566<Lc/L5 holds for the resonator.

Still another aspect is as follows. The frame includes a left frame and a right frame. The left and right frames extend along the at least one vibration arm and are disposed on opposite sides with the at least one vibration arm being disposed between the left frame and the right frame. The holding arm includes a holding side arm extending along the at least one vibration arm. The holding side arm is connected to the left frame or the right frame of the holding part.

The frequency of the spurious mode may thus be adjustable by changes in the design of the holding side arm. The high degree of flexibility in the design of the holding arm increases the possibility that the value of Fs/Fm will become close to 2. Satisfying the relevant conditional expressions for Fs/Fm by means of design is an important factor in providing resonators having favorable DLD characteristics.

Still another aspect is as follows. The at least one vibration arm includes an arm portion and a mass addition portion. The arm portion extends from the front end of the base. The mass addition portion is connected to a tip of the arm portion and is heavier in weight per unit length than the arm portion. The holding side arm is connected to the left frame or the right frame of the holding part in such a manner that the junction between the holding side arm and the left or right frame faces the arm portion.

The holding side arm and the mass addition portion wider than the arm portion do not lie side by side. This layout enables a reduction in the dimension of the resonator.

Still another aspect of the present invention provides a resonator including a base, at least one vibration arm, a frame, and a holding arm. The at least one vibration arm includes a piezoelectric film, an upper electrode, and a lower electrode. The upper and lower electrodes are disposed on opposite sides with the piezoelectric film therebetween. The at least one vibration arm has a fixed end connected to a front end of the base and an open end located away from the front end. The frame holds the base section. The holding arm forms a connection between the base and the frame. The holding arm includes a holding rear arm and a holding side arm. The holding rear arm is connected to a rear end opposite the front end of the base and extends along the rear end. The holding side arm is connected to the holding rear arm and extends along the at least one vibration arm. The inequality Lc/L5<0.520 or the inequality 0.550<Lc/L5 holds, where Lc is the distance between an edge farther than any other edge of the holding rear arm from the holding side arm and an edge farther than any other edge of the holding side arm from the holding rear arm, and L5 is the length of an imaginary vibration arm of constant width. It is noted that the imaginary vibration arm is obtained by transforming the at least one vibration arm into a form whose moment of inertia is equal to the moment of inertia of the at least one vibration arm.

In still another aspect, the inequality Lc/L5<0.506 or the inequality 0.566<Lc/L5 holds for the resonator.

Still another exemplary aspect of the present invention provides a resonance device including the resonator, a lower cover, and an upper cover. The lower cover is joined to the resonator. The upper cover is joined to the lower cover with the resonator therebetween. A vibration space in which the at least one vibration arm vibrates is defined between the upper cover and the lower cover.

As has been described so far, a resonator having favorable DLD characteristics and a resonance device including the resonator are provided in accordance with the aspects of the present invention.

The exemplary embodiments above have been described to facilitate the understanding of the present invention and should not be construed as limiting the scope of the present invention. The present invention may be altered and/or improved as would be appreciated to one skilled in the art without departing from the spirit of the present invention and embraces equivalents thereof. That is, the embodiments with design changes made as appropriate by those skilled in the art fall within the scope of the present invention as long as the features of the present invention are involved. For example, components in the embodiments above and the arrangement, materials, conditions, shapes, and sizes of the components are not limited to those mentioned in the description and may be changed as appropriate. Varying combinations of the components of the embodiments may be devised as long as they are technically possible, and these combinations also fall within the scope of the present invention as long as the features of the present invention are involved.

REFERENCE SIGNS LIST 1 resonance device
10 resonator
20 lower cover
30 upper cover
21, 31 recess
22, 32 bottom plate
23, 33 side wall
110 vibration part
121A to 121D vibration arm
122A to 122D mass addition portion
123A to 123D arm portion
125A to 125D mass addition film
130 base section
131A front end portion
131B rear end portion
131C left end portion
131D right end portion
140 holding part
141A front frame
141B rear frame
141C left frame
141D right frame
150 holding arm
151A left holding arm
151B right holding arm
152A, 152B holding rear arm
153A, 153B holding side arm
F2 Si substrate
F21 temperature characteristics correction layer
F3 piezoelectric film
F5 protective film
E1 metal film (lower electrode)
E2 metal film (upper electrode)

The invention claimed is:

1. A resonator comprising:
a base;
at least one vibration arm extending from a front end of the base and including an upper electrode, a lower electrode and piezoelectric film disposed therebetween;
a frame that holds the base; and
a holding arm that connects the base to the frame, wherein the at least one vibration arm is configured to vibrate in a main mode at a frequency Fm,
wherein the holding arm is configured to operate in a spurious mode at a frequency Fs, and
wherein the resonator is constructed such that Fs/Fm<1.9 or Fs/Fm>2.1.

2. The resonator according to claim 1, wherein the at least one vibration arm has a fixed end connected to the front end of the base and an open end located away from the front end.

3. The resonator according to claim 1, wherein the resonator is constructed such that Fs/Fm<1.8 or Fs/Fm>2.2.

4. The resonator according to claim 1, wherein the holding arm includes a rear arm connected to a rear end of the base that is opposite the front end of the base and that extends along the rear end, and a side arm that is connected to the rear arm and extends along the at least one vibration arm.

5. The resonator according to claim 4,
wherein Lc is a distance between an edge that is farther than any other edge of the rear arm from the side arm and an edge that farther than any other edge of the side arm from the rear arm,
wherein L5 is a length of an imaginary vibration arm having a constant width, with the imaginary vibration arm being obtained by transforming the at least one vibration arm into a form for the imaginary vibration arm that has a moment of inertia that is equal to a moment of inertia of the at least one vibration arm, and
wherein the resonator is constructed such that Lc/L5<0.520 or Lc/L5>0.550.

6. The resonator according to claim 5, wherein the resonator is constructed such that Lc/L5<0.506 or Lc/L5>0.566.

7. The resonator according to claim 1, wherein the frame includes a left frame and a right frame that extend along the at least one vibration arm and are disposed on opposite sides with the at least one vibration arm being disposed between the left frame and the right frame.

8. The resonator according to claim 7, wherein the holding arm includes a side arm that extends along the at least one vibration arm, and the side arm is connected to the left frame or the right frame of the frame.

9. The resonator according to claim 8, wherein the at least one vibration arm includes an arm portion that extends from the front end of the base, and a mass addition portion that is connected to a tip of the arm portion and is heavier in weight per unit length than the arm portion.

10. The resonator according to claim 9, wherein the side arm is connected to the left frame or the right frame such that a junction between the side arm and the left or right frame faces the arm portion.

11. A resonance device comprising:
the resonator according to claim 1;
a lower cover coupled to the resonator;
an upper cover coupled to the lower cover with the resonator therebetween; and
a vibration space defined between the lower and upper cover in which the at least one vibration arm vibrate therein.

12. A resonator comprising:
a base;
at least one vibration arm that extends from a front end of the base and that includes an upper electrode, a lower electrode, and a piezoelectric film disposed therebetween;
a frame that holds the base; and
a holding arm that connects the base section to the frame, wherein the holding arm includes:
a rear arm connected to a rear end of the base that is opposite the front end of the base and extends along the rear end, and
a side arm connected to the rear arm and that extends along the at least one vibration arm, and
wherein Lc is a distance between an edge that is farther than any other edge of the rear arm from the side arm and an edge that farther than any other edge of the side arm from the rear arm,
wherein L5 is a length of an imaginary vibration arm having a constant width, with the imaginary vibration arm being obtained by transforming the at least one vibration arm into a form for the imaginary vibration arm that has a moment of inertia that is equal to a moment of inertia of the at least one vibration arm, and
wherein the resonator is constructed such that Lc/L5<0.520 or Lc/L5>0.550.

13. The resonator according to claim 12, wherein the at least one vibration arm has a fixed end connected to the front end of the base and an open end disposed away from the front end.

14. The resonator according to claim 12, wherein the resonator is constructed such that Lc/L5<0.506 or Lc/L5>0.566.

15. A resonator comprising:
a base;
at least one vibration arm extending from the base and including an upper electrode, a lower electrode and piezoelectric film disposed therebetween;
a frame that surrounds the base; and
a holding arm that connects the base to the frame,
wherein the at least one vibration arm vibrates in a main mode at a frequency Fm and the holding arm operates in a spurious mode at a frequency Fs, and
wherein the at least one vibration arm and the holding arm are configured such that Fs/Fm<1.9 or Fs/Fm>2.1.

16. The resonator according to claim 15, wherein the at least one vibration arm and the holding arm are configured such that Fs/Fm<1.8 or Fs/Fm>2.2.

17. The resonator according to claim 15,
wherein the holding arm includes a rear arm connected to the base on a side opposite the at least one vibration arm and that extends along the base, and a side arm that is connected to the rear arm and extends along the at least one vibration arm, and
wherein Lc is a distance between an edge that is farther than any other edge of the rear arm from the side arm and an edge that farther than any other edge of the side arm from the rear arm,
wherein L5 is a length of an imaginary vibration arm having a constant width, with the imaginary vibration arm being obtained by transforming the at least one vibration arm into a form for the imaginary vibration arm that has a moment of inertia that is equal to a moment of inertia of the at least one vibration arm, and
wherein the at least one vibration arm and the holding arm is constructed such that Lc/L5<0.520 or Lc/L5>0.550.

18. The resonator according to claim 17, wherein the at least one vibration arm and the holding arm is constructed such that Lc/L5<0.506 or Lc/L5>0.566.

19. The resonator according to claim 15,
wherein the frame includes a left frame and a right frame that extend along the at least one vibration arm and are disposed on opposite sides with the at least one vibration arm being disposed between the left frame and the right frame, and wherein the holding arm includes a side arm that extends along the at least one vibration arm, and the side arm is connected to the left frame or the right frame of the frame.

20. The resonator according to claim 19, wherein the at least one vibration arm includes an arm portion that extends from the base, and a mass addition portion that is connected to a tip of the arm portion and is heavier in weight per unit length than the arm portion.

* * * * *